United States Patent
Tsurunari et al.

(10) Patent No.: US 9,419,584 B2
(45) Date of Patent: *Aug. 16, 2016

(54) ANTENNA SHARING DEVICE

(75) Inventors: Tetsuya Tsurunari, Osaka-Fu (JP); Joji Fujiwara, Osaka-Fu (JP); Hiroyuki Nakamura, Osaka-Fu (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 328 days.

This patent is subject to a terminal disclaimer.

(21) Appl. No.: 13/497,270

(22) PCT Filed: Feb. 17, 2011

(86) PCT No.: PCT/JP2011/000869
§ 371 (c)(1),
(2), (4) Date: Mar. 21, 2012

(87) PCT Pub. No.: WO2011/102128
PCT Pub. Date: Aug. 25, 2011

(65) Prior Publication Data
US 2012/0218052 A1  Aug. 30, 2012

(30) Foreign Application Priority Data

Feb. 22, 2010  (JP) .................................. 2010-035573
Jan. 20, 2011  (JP) .................................. 2011-009634

(51) Int. Cl.
*H03H 9/64*   (2006.01)
*H03H 9/72*   (2006.01)
(Continued)

(52) U.S. Cl.
CPC ....... *H03H 9/02984* (2013.01); *H03H 9/02559* (2013.01); *H03H 9/568* (2013.01); *H03H 9/6483* (2013.01); *H03H 9/706* (2013.01); *H03H 9/725* (2013.01)

(58) Field of Classification Search
CPC ... H03H 9/02559; H03H 9/0222; H03H 3/08; H03H 3/10
USPC ........... 333/133, 193–196; 310/313 R–313 D
See application file for complete search history.

(56) References Cited

U.S. PATENT DOCUMENTS 6,246,302 B1   6/2001 Müller et al.
8,698,578 B2 *  4/2014 Nakanishi .......... H03H 9/02559
                                                      333/133
(Continued)

FOREIGN PATENT DOCUMENTS

CN   101128977   2/2008
CN   101379699   3/2009
(Continued)

OTHER PUBLICATIONS

Chinese Office Action issued Mar. 21, 2014 in corresponding Chinese application (in English).
(Continued)

*Primary Examiner* — Dean Takaoka
*Assistant Examiner* — Alan Wong
(74) *Attorney, Agent, or Firm* — Lando & Anastasi, LLP

(57) ABSTRACT

An antenna duplexer has a first filter passing a signal in a first frequency band and a second filter passing a signal in a second frequency band which is higher than the first frequency band. The first filter includes a first series resonator having a lowest antiresonance frequency and second series resonators. A propagation angle of a main elastic wave of the first series resonator a propagation angle of a main elastic wave of each of the second series resonators are different from each other so that an electromechanical coupling coefficient of the first series resonator is smaller than an electromechanical coupling coefficient of the second series resonators.

17 Claims, 20 Drawing Sheets

(51) Int. Cl.
*H03H 9/02* (2006.01)
*H03H 9/56* (2006.01)
*H03H 9/70* (2006.01)

(56) References Cited

U.S. PATENT DOCUMENTS

| | | |
|---|---|---|
| 2001/0008387 A1 | 7/2001 | Taniguchi |
| 2004/0061575 A1 | 4/2004 | Kando et al. |
| 2007/0090898 A1 | 4/2007 | Kando |
| 2007/0096592 A1 | 5/2007 | Kadota et al. |
| 2007/0241840 A1 | 10/2007 | Takayama et al. |
| 2008/0116993 A1* | 5/2008 | Yamakawa et al. ............ 333/124 |
| 2009/0115287 A1* | 5/2009 | Kando ...................... 310/313 A |
| 2009/0206955 A1 | 8/2009 | Iizawa |
| 2010/0164646 A1 | 7/2010 | Nakanishi et al. |
| 2010/0207707 A1* | 8/2010 | Yata ............................... 333/195 |
| 2010/0219905 A1 | 9/2010 | Nakamura et al. |
| 2012/0139662 A1 | 6/2012 | Fujiwara et al. |

FOREIGN PATENT DOCUMENTS

| | | |
|---|---|---|
| CN | 101515792 A | 8/2009 |
| EP | 1971026 A1 | 9/2008 |
| JP | 07-154199 | 6/1995 |
| JP | 07-283688 | 10/1995 |
| JP | 2001-500697 | 1/2001 |
| JP | 2001-203556 | 7/2001 |
| JP | 2004135267 A | 4/2004 |
| JP | 2006295976 A | 10/2006 |
| JP | 2008078981 A | 4/2008 |
| JP | 2008-532334 | 8/2008 |
| WO | 98/12806 | 3/1998 |
| WO | 2005/034347 | 4/2005 |
| WO | 2005/060094 | 6/2005 |
| WO | 2006/003933 | 1/2006 |
| WO | 2006/093063 | 9/2006 |
| WO | 2006114930 A1 | 11/2006 |
| WO | 2007/094368 | 8/2007 |
| WO | WO 2009119007 A1 * | 10/2009 |

OTHER PUBLICATIONS

International Search Report issued Mar. 22, 2011 in International (PCT) Application No. PCT/JP2011/000869.

* cited by examiner

FIG. 4

|  | ANTIRESONANCE FREQUENCY (MHz) | CAPACITANCE (pF) | PROPAGATION ANGLE (DEGREES) | ELECTROMECHANICAL COUPLING COEFFICIENT (%) |
|---|---|---|---|---|
| FIRST SERIES RESONATOR | 1938 | 2 | 10 | 7.9 |
| SECOND SERIES RESONATOR | 1929 | 3.6 | 10 | 7.9 |
| THIRD SERIES RESONATOR | 1975 | 1.1 | 7.4 | 8.6 |
| FOURTH SERIES RESONATOR | 1956 | 0.7 | 7.4 | 8.6 |

FIG. 5

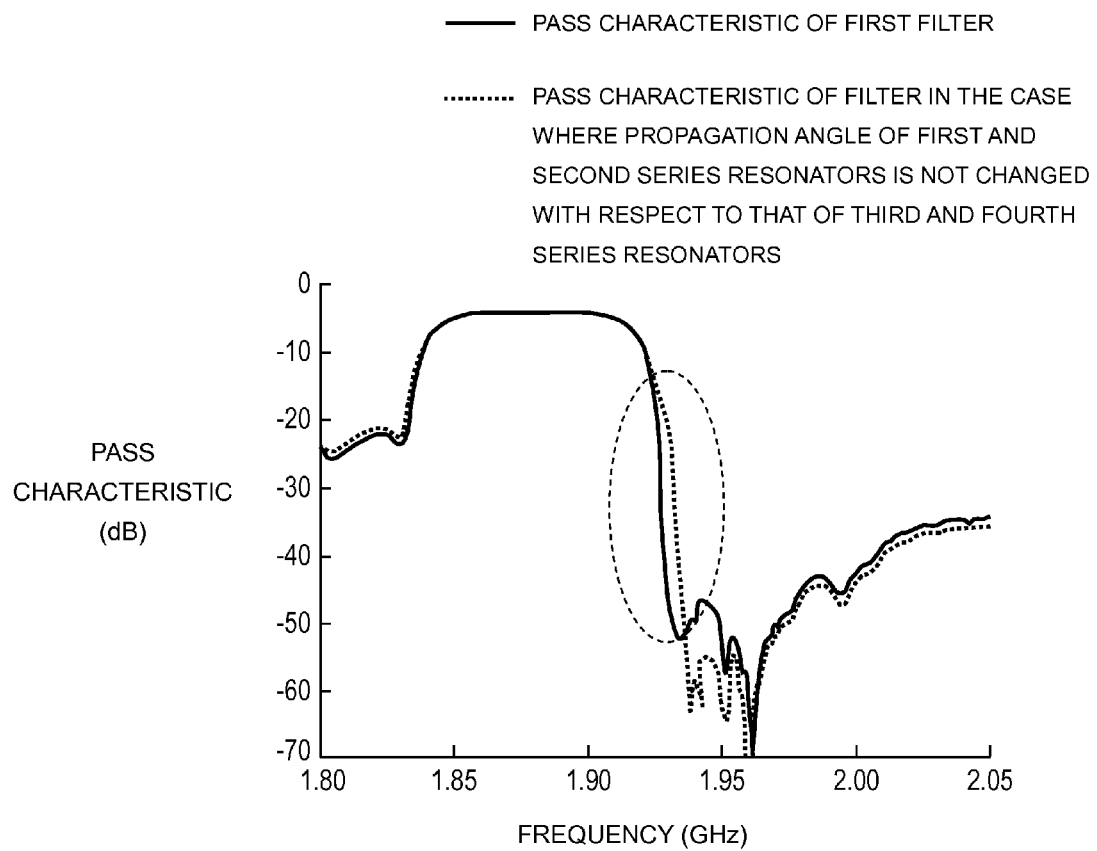

— PASS CHARACTERISTIC OF FIRST FILTER

·········· PASS CHARACTERISTIC OF FILTER IN THE CASE WHERE PROPAGATION ANGLE OF FIRST AND SECOND SERIES RESONATORS IS NOT CHANGED WITH RESPECT TO THAT OF THIRD AND FOURTH SERIES RESONATORS

ANTENNA SHARING DEVICE

This application is a U.S. national stage application of the PCT international application No. PCT/JP2011/000869, filed Feb. 17, 2011.

BACKGROUND OF THE INVENTION

1. Technical Field

The present invention relates to an antenna duplexer having a plurality of filters.

2. Background Art

In recent years, a cellular phone of a communication system of performing transmission/reception simultaneous communication such as W-CDMA (Wideband Code Division Multiple Access) is being rapidly spread. Accordingly, demand of an antenna duplexer such as a duplexer is increasing. As elements constructing an antenna duplexer, an SAW (Surface Acoustic Wave) element, a boundary elastic wave element, a BAW (Bulk Acoustic wave) element, and the like which are excellent from the viewpoints of small size, low height, and mass production are mainstream.

Generally, an antenna duplexer has two filters (a transmission filter and a reception filter) to separate a signal in a transmission band and a signal in a reception band neighboring the high frequency side of the transmission band from each other. Particularly, as the transmission filter, a ladder filter in which series resonators and parallel resonators are connected in a ladder shape is employed.

For example, the gap (crossband) between the transmission band and the reception band in Band2 determined in 3GPP ($3^{rd}$ Generation Partnership Project) is 20 MHz (1.06% in expression of fractional bandwidth). The gap is narrower as compared with 20 MHz (fractional bandwidth: 2.36%) as the crossband of Band5 often used in conventional antenna duplexers.

Therefore, a technique of adding weight on an IDT (Inter Digital Transducer) of a resonator of a transmission filter in order to assure steepness to address the narrow crossband is proposed (refer to, for example, Japanese Translation of PCT Application No. 2001-500697).

Various techniques of making the propagation angles of the main elastic waves of resonators in a ladder filter are also proposed (refer to, for example, Japanese Unexamined Patent Publication No. H07-283688 and WO 2005/060094).

However, Japanese Translation of PCT Application No. 2001-500697 relates to the technique for narrowing the bandwidth and does not disclose means realizing an antenna duplexer whose bandwidth is wide like 60 MHz in Band2. That is, the transmission filter in the antenna duplexer disclosed in Japanese Translation of PCT Application No. 2001-500697 has a problem such that when steepness is increased to sufficiently assure attenuation in the reception band, the transmission bandwidth is narrowed, and a loss in a wide passband increases. Particularly, the fractional bandwidth of the transmission/reception passband in Band2 is 3.2% and wide, and it is very difficult to maintain a small loss in the wide transmission passband.

It is expected that, in future, not only in Band2 but also Band3, Band8, and the like, an antenna duplexer capable of satisfying both a low loss characteristic in a wide band and a steep attenuation characteristic is in demand.

Conventionally known techniques, however, have a problem such that when a low loss characteristic is realized in a wide band, sufficient steepness cannot be obtained.

SUMMARY OF THE INVENTION

The present invention has been achieved in consideration of the problems and an object of the invention is to realize both steepness in the crossband and a low loss characteristic in a passband in an antenna duplexer.

An antenna duplexer of the present invention has a first filter passing a signal in a first frequency band and a second filter passing a signal in a second frequency band higher than the first frequency band. The first filter has a ladder filter having a piezoelectric body, a protective film formed on the piezoelectric body, and an electrode which is formed between the piezoelectric body and the protective film and excites a main elastic wave, and formed by connecting a plurality of resonators including the electrode in series and in parallel. The ladder filter has a plurality of series resonators, and the plurality of series resonators include a series resonator having a lowest antiresonance frequency and other resonators other than the series resonator having the lowest antiresonance frequency, and a propagation angle of the main elastic wave of the series resonator having the lowest antiresonance frequency and that of the main elastic wave of the other resonators are made different from each other so that an electromechanical coupling coefficient of the series resonator having the lowest antiresonance frequency becomes smaller than that of the other resonators.

An antenna duplexer of the present invention has a first filter passing a signal in a first frequency band and a second filter passing a signal in a second frequency band higher than the first frequency band. The second filter includes a ladder filter having a piezoelectric body, a protective film formed on the piezoelectric body, and an electrode which is formed between the piezoelectric body and the protective film and excites a main elastic wave, and formed by connecting resonators including the electrode in series and in parallel. The ladder filter has a plurality of parallel resonators, the plurality of parallel resonators include a parallel resonator having a highest resonance frequency and other resonators other than the parallel resonator having the highest resonance frequency, and a propagation angle of the main elastic wave of the parallel resonator having the highest resonance frequency and that of the main elastic wave of the other resonators are made different from each other so that an electromechanical coupling coefficient of the parallel resonator having the highest resonance frequency becomes smaller than that of the other resonators.

Further, an antenna duplexer of the present invention has a first filter passing a signal in a first frequency band and a second filter passing a signal in a second frequency band higher than the first frequency band. The first filter includes a ladder filter having a piezoelectric body, a protective film formed on the piezoelectric body, and an electrode which is formed between the piezoelectric body and the protective film and excites a main elastic wave, and formed by connecting a plurality of resonators including the electrode in series and in parallel. The ladder filter has a plurality of series resonators, the plurality of series resonators include one series resonator and other series resonators having an antiresonance frequency higher than that of the one series resonator, and a propagation angle of the main elastic wave of the one series resonator and that of the main elastic wave of the other series resonators are made different from each other so that an electromechanical coupling coefficient of the one series resonator becomes smaller than that of the other resonators.

BRIEF DESCRIPTION OF DRAWINGS

FIG. 4 is a diagram illustrating antiresonance frequency, capacitance, propagation angle ψ, and electromechanical coupling coefficient of each of series resonators constructing the first filter in the antenna duplexer according to the first embodiment of the invention.

FIG. 5 is a diagram showing pass characteristic of the first filter in the antenna duplexer according to the first embodiment of the invention.

DESCRIPTION OF EMBODIMENTS

First Exemplary Embodiment

A first exemplary embodiment of the present invention will now be described with reference to the drawings.

Figure 1:
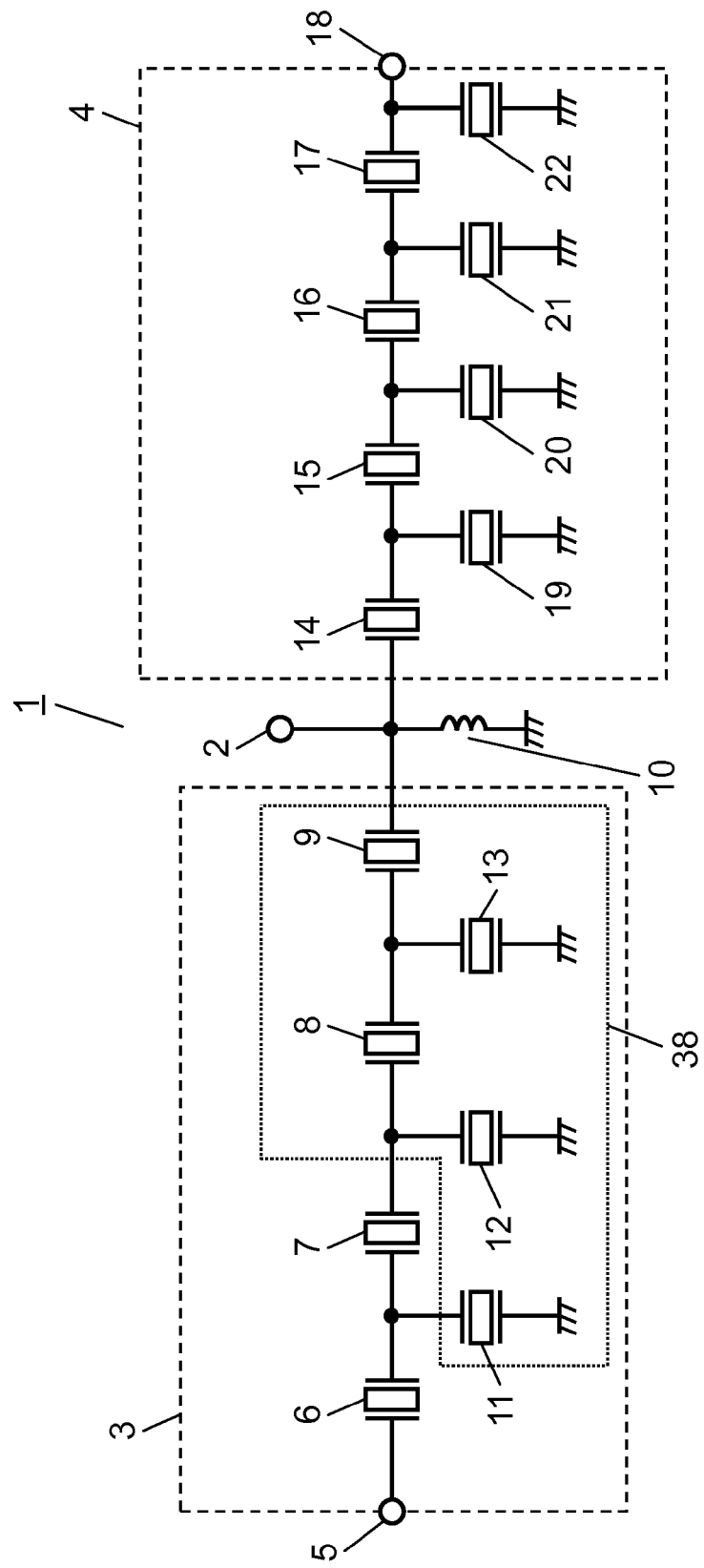
FIG. 1 is a schematic circuit diagram of an antenna duplexer in a first exemplary embodiment of the present invention.

FIG. 1 is a schematic circuit diagram of antenna duplexer 1 in the first exemplary embodiment of the present invention.

Antenna duplexer 1 in the embodiment has first filter 3 as a transmission filter and second filter 4 as a reception filter each connected to antenna terminal 2. Antenna duplexer 1 has phase shifter 10 connected between first and second filters 3 and 4 to assure isolation between first and second filters 3 and 4.

Antenna duplexer 1 is, for example, for band 2. First filter 3 passes a signal in a first frequency band (transmission band) of 1850 MHz to 1910 MHz, and second filter 4 passes a signal in a second frequency band (reception band) of 1930 MHz to 1990 MHz higher than the first frequency band.

The circuit configuration of each of first and second filters 3 and 4 will now be described specifically.

First filter 3 has input terminal 5, and first series resonator 6, second series resonator 7, third series resonator 8, and fourth series resonator 9 which are connected in order from input terminal 5 and in series to antenna terminal 2. First filter 3 also has first parallel resonator 11 grounded and connected in parallel between first and second series resonators 6 and 7, second parallel resonator 12 grounded and connected in parallel between second and third series resonators 7 and 8, and third parallel resonator 13 grounded and connected in parallel between third and fourth series resonators 8 and 9.

Second filter 4 has, between antenna terminal 2 and output terminal 18, fifth series resonator 14, sixth series resonator 15, seventh series resonator 16, and eighth series resonator 17 connected in order from antenna terminal 2 side and in series. Second filter 4 also has fourth parallel resonator 19 grounded and connected in parallel between fifth and sixth series resonators 14 and 15, fifth parallel resonator 20 grounded and connected in parallel between sixth and seventh series resonators 15 and 16, sixth parallel resonator 21 grounded and connected in parallel between seventh and eighth series resonators 16 and 17, and seventh parallel resonator 22 grounded and connected in parallel between eighth series resonator 17 and output terminal 18. Second filter 4 may have a multiple-mode elastic wave filter (not shown).

Figure 2:
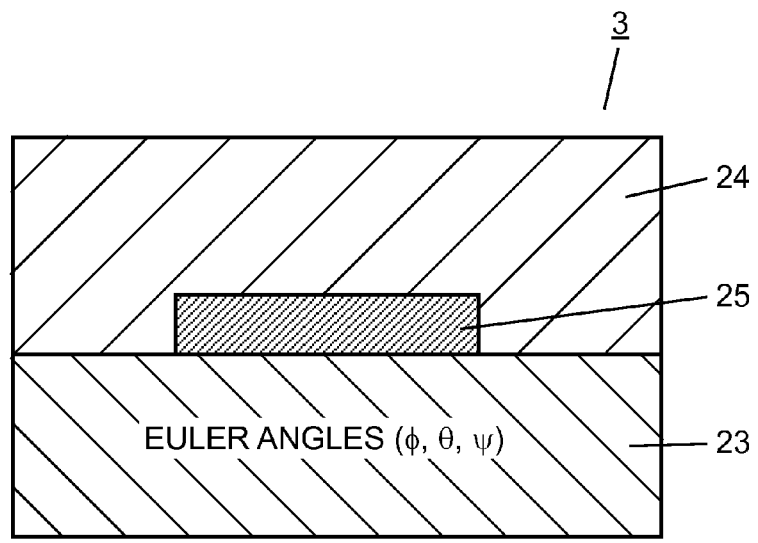
FIG. 2 is a schematic cross section of a first filter in the antenna duplexer in the first exemplary embodiment of the invention.

FIG. 2 is a schematic cross section of first filter 3 in antenna duplexer 1 in the first exemplary embodiment of the invention. First filter 3 has piezoelectric body 23, protective film 24 formed on piezoelectric body 23, and electrode 25 as an IDT (Inter-Digital Transducer) formed between piezoelectric body 23 and protective film 24 and exciting a main elastic wave which is, for example, an SH (Shear Horizontal) wave having a wavelength λ. Each of the above-described resonators is formed by piezoelectric body 23, protective film 24, and electrode 25.

Electrode 25 is an electrode having a comb shape and is made of, for example, a single metal such as aluminum, copper, silver, gold, titanium, tungsten, molybdenum, platinum, or chromium, an alloy whose main component is any of the metals, or a stacked body of any of the metals. The metallization ratio (duty) expressed by "electrode finger width/pitch" of electrode 25 is, desirably, equal to or higher than 0.45 and lower than 0.6 from the viewpoint of mass production and lower loss rate.

Piezoelectric body 23 is a piezoelectric single crystal substrate made of lithium niobate based body ($LiNbO_3$), lithium tantalate ($LiTaO_3$), or the like. Particularly, in the case where piezoelectric body 23 is made of a lithium niobate based body ($LiNbO_3$)-based material, for reasons to be described later, preferably, the Euler angles (φ, θ, ψ) of piezoelectric body 23 in third and fourth series resonators 8 and 9 and first, second, and third parallel resonators 11, 12, and 13 satisfy the relations of −100°≤θ≤−60°, 1.193φ−2°≤ψ≤1.193φ+2°, and ψ≤−2φ−3°, and −2φ+3°≤ψ. Each of φ and θ denotes a cutting angle of piezoelectric body 23, and ψ denotes the propagation angle of the main elastic wave of third and fourth series resonators 8 and 9 and first, second, and third parallel resonators 11, 12, and 13.

Since piezoelectric body 23 of a lithium niobate based body is trigonal crystal, the Euler angles have the following relation.

$$(\phi, \theta, \psi) = (60 + \phi, -\theta, \psi)$$
$$= (60 - \phi, -\theta, 180 - \psi)$$
$$= (\phi, 180 + \theta, 180 - \psi)$$
$$= (\phi, \theta, 180 + \psi)$$

Protective film 24 is, for example, a silicon oxide ($SiO_2$) film. Protective film 24 has a temperature characteristic opposite to that of piezoelectric body 23. In the case where protective film 24 is made of silicon oxide, by making the thickness of the film larger than a predetermined film thickness, the frequency temperature characteristic of first filter 3 can be improved. At this time, the Euler angles ($\phi$, $\theta$, $\psi$) are changed in third and fourth series resonators 8 and 9 and first, second, and third parallel resonators 11, 12, and 13 other than first and second series resonators 6 and 7, in piezoelectric body 23 made of lithium niobate based body. Concretely, $\phi$ and $\psi$ are set to predetermined angle or larger and changed so as to follow the relation of $\psi=1.193\phi$ to a certain degree. By the operation, while suppressing generation of unnecessary spurious signals caused by the Rayleigh wave, unnecessary spurious signals around a frequency band in which a fast transverse wave is generated can be also suppressed. The unnecessary spurious signal suppression action will be described later.

Figure 3:
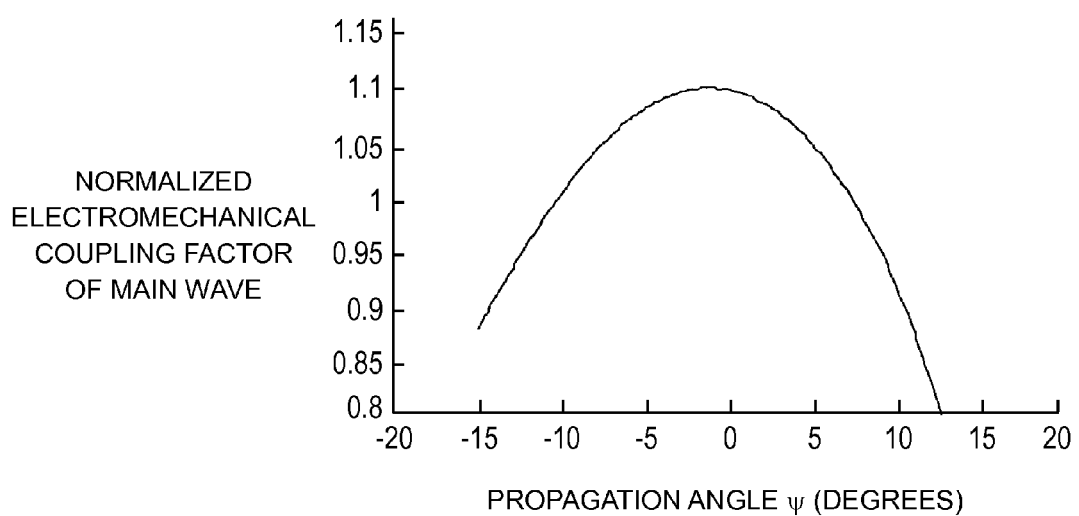
FIG. 3 is a diagram showing an electromechanical coupling coefficient of the first filter in the antenna duplexer according to the first embodiment of the invention.

FIG. 3 is a diagram showing an electromechanical coupling coefficient of first filter 3 in antenna duplexer 1 according to the first embodiment of the invention. In the example of FIG. 3, it is assumed that piezoelectric body 23 is made of lithium niobate based body having the Euler angles (6°, −87.5°, $\psi$°), electrode 25 is made of aluminum having a thickness of 0.12λ, and protective film 24 is made of silicon oxide having a thickness of 0.35λ and has, in its top face, a projection above an electrode finger of electrode 25. FIG. 3 shows the electromechanical coupling coefficient of the main elastic wave in the case where the propagation angle w is changed. As the electromechanical coupling coefficient, a value standardized with a value at the time of $\psi=7.4°$ is shown. The height of the projection is larger than 0.03λ and is equal to or less than the height of electrode 25, and the width of a top part of the projection is smaller than that of the electrode finger of electrode 25.

In the specification, the thickness of protective film 24 is defined as a distance from a boundary face between piezoelectric body 23 and protective film 24 to the top face of protective film 24, in a part where piezoelectric body 23 and protective film 24 are in contact (in the part where electrode 25 is not formed).

As shown in FIG. 3, when first filter 3 in the embodiment is used, by changing the propagation angle $\psi$, the electromechanical coupling coefficient of the main elastic wave can be suppressed. The electromechanical coupling coefficient of the main elastic wave in first filter 3 is 9.6% at maximum in the case where the propagation angle $\psi=0°$.

Next, as an example of first filter 3, the case where piezoelectric body 23 is made of lithium niobate based body having the Euler angles (6°, −87.5°, 7.4°), electrode 25 is made of aluminum having a thickness of 0.12λ, and protective film 24 is made of silicon oxide having a thickness of 0.35λ and has, in its top face, a projection above an electrode finger of electrode 25 will be described.

FIG. 4 is a diagram illustrating antiresonance frequency, capacitance, propagation angle $\psi$, and electromechanical coupling coefficient of each of the series resonators constructing first filter 3 in antenna duplexer 1 according to the first embodiment of the invention.

As shown in FIG. 4, the antiresonance frequency of second series resonator 7 is lower than that of the other series resonators, that is, first, third, and fourth series resonators 6, 8, and 9. The electromechanical coupling coefficient of first and second series resonators 6 and 7 including second series resonator 7 is made smaller than that of other third and fourth series resonators 8 and 9. Consequently, the propagation angle w of the main elastic wave of first and second series resonators 6 and 7 is made different from that of the main elastic wave of third and fourth series resonators 8 and 9.

In the embodiment, first filter 3 in which the propagation angle w in the Euler angles of piezoelectric body 23, of first and second series resonators 6 and 7 is made different from that of third and fourth series resonators 8 and 9 will be described. However, the invention is not limited to the case. For example, the electromechanical coupling coefficient of second series resonator 7 having the lowest antiresonance frequency among the plurality of series resonators may be made smaller than that of first, third, and fourth series resonators 6, 8, and 9 as the other resonators. In this case, it is sufficient to make the propagation angle w of the main elastic wave of second series resonator 7 having the lowest antiresonance frequency different from that of the main elastic wave of first, third and fourth series resonators 6, 8, and 9 as the other resonators.

FIG. 5 is a diagram showing pass characteristic of first filter 3 in antenna duplexer 1 according to the first embodiment of the invention. FIG. 5 shows comparison between the pass characteristic of first filter 3 of the embodiment and that of a filter in which the propagation angle $\psi$ of first and second series resonators 6 and 7 is not changed with respect to that of third and fourth series resonators 8 and 9.

As shown in FIG. 5, by making the propagation angle of first and second series resonators 6 and 7 larger than that of third and fourth series resonators 8 and 9, the slope characteristic in a high frequency side (portion surrounded by dotted line) in the passband of first filter 3 can be made steep.

As described above, first filter 3 in antenna duplexer 1 in the embodiment has protective film 24 formed on piezoelectric body 23 so as to cover electrode 25. With such a configuration, by changing the propagation angle $\psi$ (propagation direction) of the main elastic wave in each of the series resonators, the electromechanical coupling coefficient of the main elastic wave in each of the series resonators can be controlled widely.

Further, in first filter 3, by making the electromechanical coupling coefficient of second series resonator 7 having the lowest antiresonance frequency, which exerts large influence on steepness smaller than that of the other resonators, the steepness in the crossband can be improved.

In the series resonators (hereinbelow, described as other series resonators) other than second series resonator 7 having the lowest antiresonance frequency, which exerts small influence on sharpness, that is, in the embodiment, by largely assuring the electromechanical coupling coefficient of third series resonator 8 having relatively high antiresonance frequency, the passband width can be widened, and a loss can be suppressed in a wide transmission passband. That is, antenna duplexer 1 of the embodiment can satisfy both steepness in the crossband and lower loss in the transmission passband.

As shown in FIG. 4, preferably, the capacitance of second series resonator 7 having the lowest antiresonance frequency is set to the largest among the plurality of series resonators included in first filter 3 for the following reason. Since passage loss in the case of connecting resonators of large capacitance in series is small, at the time of changing the propagation angle, a steep slope characteristic can be obtained without accompanying deterioration in loss on the high frequency side of the passband of the filter.

The propagation angle ψ in the Euler angles of piezoelectric body 23 in the series resonators whose propagation angle is changed (in the embodiment, first and second series resonators 6 and 7) does not always have to satisfy the above-described specific range (the relations of ψ≤−2φ−3°, −2φ+3°≤ψ) for the following reason. Since the antiresonance frequency of the series resonator whose propagation angle is changed is low, the degree of influence of the unnecessary spurious signal on the passage characteristic is low. That is, in first filter 3, it is sufficient to set the Euler angle w of piezoelectric body 23 in third and fourth series resonators 8 and 9 to the above-described specific range. As a result, even when the Euler angle ψ of piezoelectric body 23 in the series resonator whose propagation angle is changed, for example, first and second series resonators 6 and 7 is set out of the above-described specific range, the unnecessary spurious signal can be suppressed, and steepness in the crossband can be improved.

The electromagnetic coupling coefficient of an arbitrary series resonator (one series resonator) other than second series resonator 7 having the lowest antiresonance frequency among the plurality of series resonators and that of another series resonator having an antiresonance frequency higher than that of the one series resonator may be made different from each other. For instance, in the example of FIG. 4, the electromechanical coupling coefficient of first series resonator 6 and that of third series resonator 8 having antiresonance frequency higher than that of first series resonator 6 are made different from each other. Specifically, the propagation angle ψ of the main elastic wave of first series resonator 6 and that of the main elastic wave of third series resonator 8 are made different from each other so that the electromechanical coupling coefficient of first series resonator 6 becomes smaller than that of third series resonator 8. As a result, both of steepness in the crossband and lower loss in the transmission passband can be satisfied.

In first filter 3 in the embodiment, in the case where first and second series resonators 6 and 7 are used as the series resonator whose propagation angle is changed, by setting the Euler angle of piezoelectric body 23 in third and fourth series resonators 8 and 9 and first, second, and third parallel resonators 11, 12, and 13 (hereinbelow, described as a group 38 of other resonators) as the resonators other than resonators 6 and 7 in a specific range, an unnecessary spurious signal can be suppressed. This action will be described.

Figure 6:
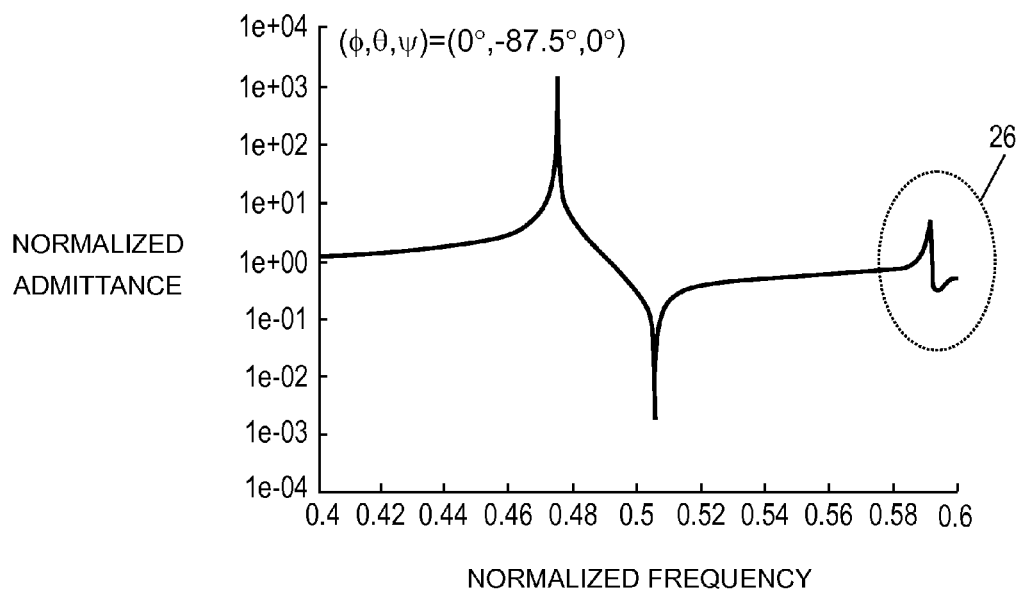
FIG. 6 is a frequency characteristic diagram of a group of other resonators in the case where a piezoelectric body of the first filter in the antenna duplexer according to the first embodiment of the invention is lithium niobate based body having Euler angles (0°, −87.5°, 0°).
Figure 7:
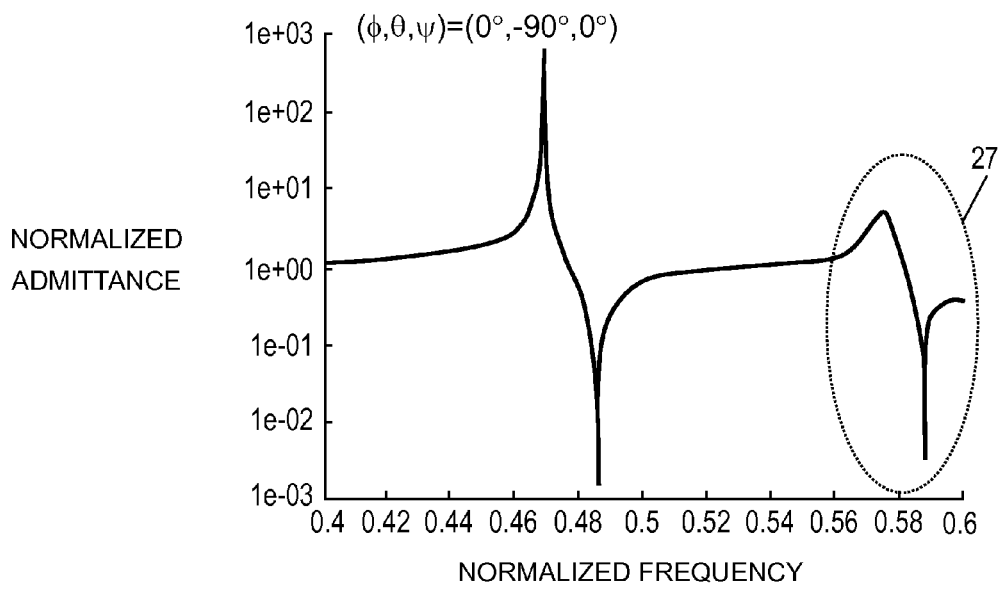
FIG. 7 is a frequency characteristic diagram of a group of other resonators in the case where a piezoelectric body of the first filter in the antenna duplexer according to the first embodiment of the invention is lithium niobate based body having Euler angles (0°, −90°, 0°).

FIG. 6 is a frequency characteristic diagram of group 38 of the other resonators in the case where piezoelectric body 23 of first filter 3 in antenna duplexer 1 in the first embodiment of the invention is made of a lithium niobate based body having Euler angles (0°, −87.5°, 0°). FIG. 7 is a frequency characteristic diagram of group 38 of the other resonators in the case where piezoelectric body 23 is made of a lithium niobate based body having Euler angles (0°, −90°, 0°). In FIGS. 6 and 7, the vertical axis indicates normalized admittance with respect to a matching value, and the horizontal axis indicates normalized frequency with respect to frequency of the half of a slow transverse wave (sound velocity 4,024 m/s) generated in group 38 of the other resonators. The axes denote the same in the other characteristic diagrams.

In the example shown in FIG. 6, electrode 25 of first filter 3 is made of copper having a thickness of 0.03λ, and protective film 24 is made of silicon oxide having a thickness of 0.35λ and the top face of protective film 24 is flat.

In the example shown in FIG. 7, electrode 25 of the first filter is made of aluminum having a thickness of 0.08λ, and protective film 24 is made of silicon oxide having a thickness of 0.35λ and has a projection in its top face, above the electrode finger of electrode 25. The height of the projection is larger than 0.03λ and is equal to or less than the height of electrode 25, and the width of a top part of the projection is smaller than that of the electrode finger of electrode 25.

As shown in FIGS. 6 and 7, when the thickness of protective film 24 made of silicon oxide is set to, for example, 0.35λ in order to improve the temperature characteristic of group 38 of the other resonators, unnecessary spurious signals 26 and 27 are generated around 1.2 times of resonance frequency. It is considered that the unnecessary spurious signals are generated due to a fast transverse wave generated in group 38 of the other resonators. A transverse wave having the highest sound velocity in transverse waves generated in group 38 of the other resonators will be described as a fast transverse wave, and a transverse wave having the lowest sound velocity in the transverse waves generated in group 38 of the other resonators will be described as a slow transverse wave.

Next, characteristic changes when, in first filter 3, piezoelectric body 23 is made of lithium niobate based body having the Euler angles (0°, −87.5°, 0°), electrode 25 is made of copper having a thickness of 0.03λ, protective film 24 is made of silicon oxide and has a flat top face, and the thickness of protective film 24 is changed will be described.

Figure 8A:
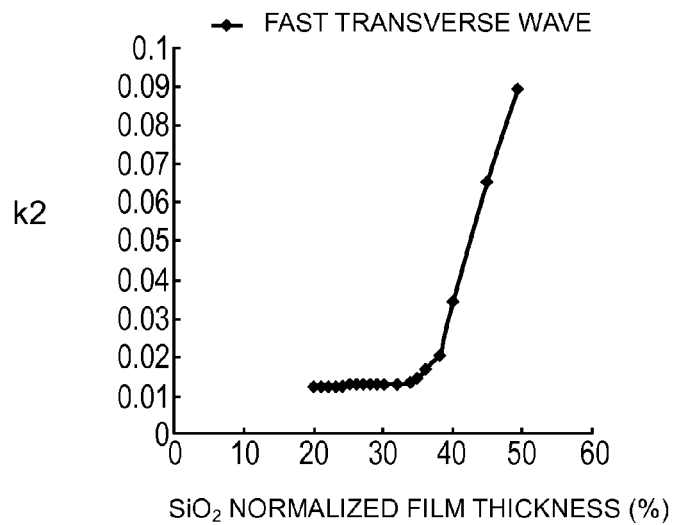
FIG. 8A is a diagram showing an electromechanical coupling coefficient (k2) of a fast transverse wave when thickness of a protective film in the first filter in the antenna duplexer according to the first embodiment of the invention is changed.
Figure 8B:
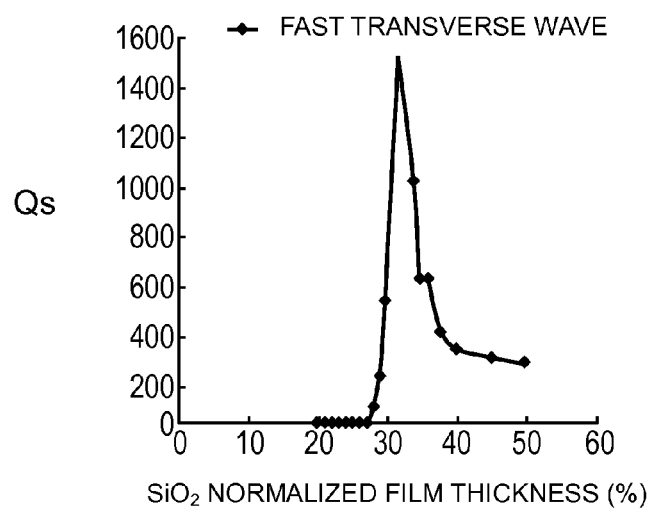
FIG. 8B is a diagram showing Q factor (Qs) of resonance of a fast transverse wave when thickness of the protective film in the first filter in the antenna duplexer according to the first embodiment of the invention is changed.
Figure 8C:
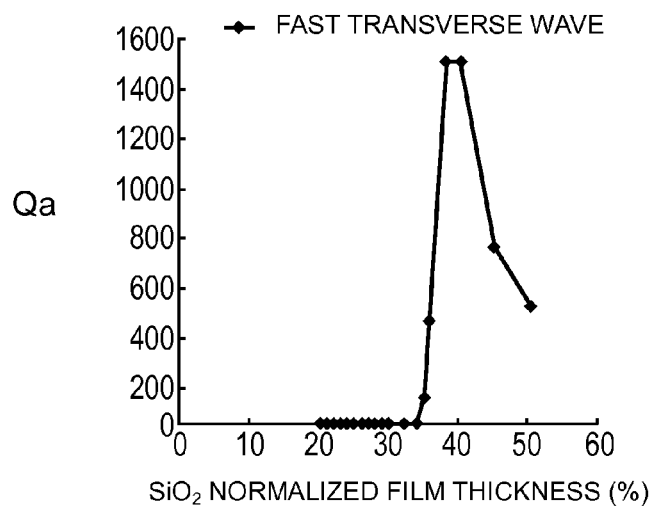
FIG. 8C is a diagram showing Q factor (Qa) of antiresonance of a fast transverse wave when thickness of the protective film in the first filter in the antenna duplexer according to the first embodiment of the invention is changed.

FIG. 8A is a diagram showing an electromechanical coupling coefficient (k2) of a fast transverse wave when thickness of protective film 24 is changed in first filter 3 in the antenna duplexer according to the first embodiment of the invention. FIG. 8B is a diagram showing Q factor (Qs) of resonance of a fast transverse wave. FIG. 8C is a diagram showing Q factor (Qa) of antiresonance of a fast transverse wave.

As shown in FIG. 8B, when the thickness of protective film 24 is set to be larger than 0.27λ (expressing 27% of wavelength λ, this expression will be similarly used in the following description), the Q factor of resonance of the fast transverse wave increases. As shown in FIG. 8C, when the thickness of protective film 24 is set to be larger than 0.34λ, the Q factor of antiresonance of the fast transverse wave also increases.

Next, characteristic changes when, in first filter 3, piezoelectric body 23 is made of lithium niobate based body having the Euler angles (0°, −90°, 0°), electrode 25 is made of aluminum having a thickness of 0.08λ, protective film 24 is made of silicon oxide and has the above-described projection in its top face above the electrode finger of electrode 25, and the thickness of protective film 24 is changed will be described.

Figure 9A:
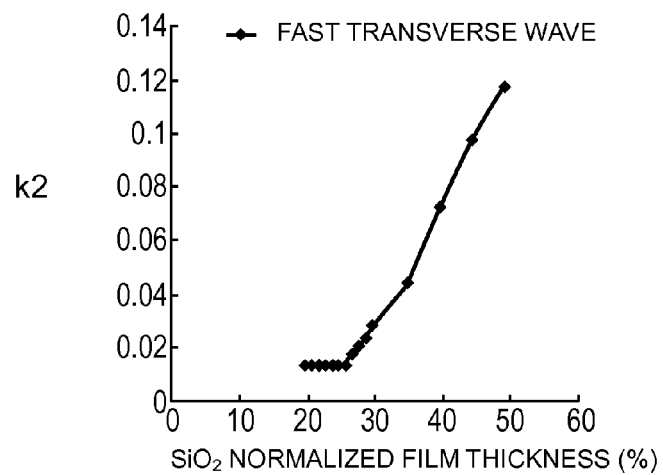
FIG. 9A is a diagram showing the electromechanical coupling coefficient (k2) of a fast transverse wave when thickness of the protective film in the first filter in the antenna duplexer according to the first embodiment of the invention is changed.
Figure 9B:
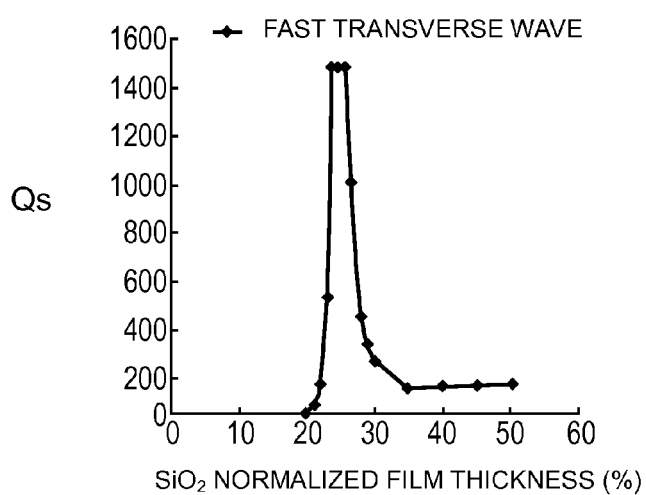
FIG. 9B is a diagram showing Q factor (Qs) of resonance of a fast transverse wave when thickness of the protective film in the first filter in the antenna duplexer according to the first embodiment of the invention is changed.
Figure 9C:
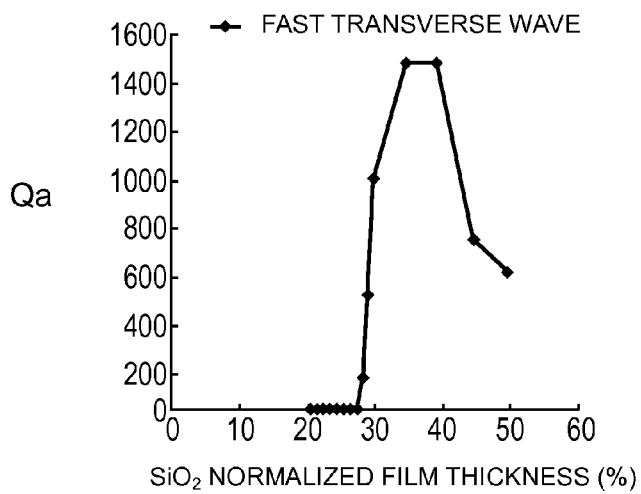
FIG. 9C is a diagram showing Q factor (Qa) of antiresonance of a fast transverse wave when thickness of the protective film in the first filter in the antenna duplexer according to the first embodiment of the invention is changed.
Figure 10A:
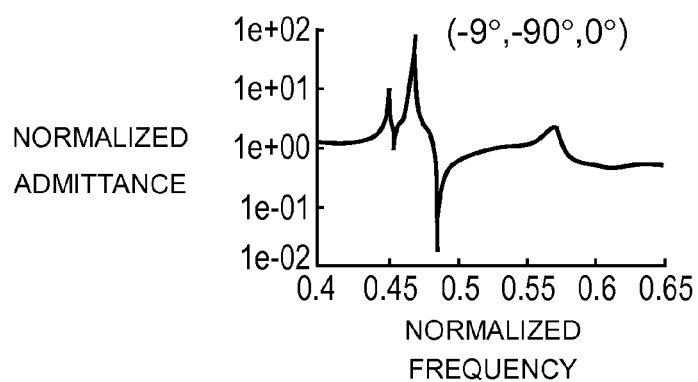
FIG. 10A is a diagram showing admittance characteristic in the case where φ=−9° in the first filter in the antenna duplexer according to the first embodiment of the invention.
Figure 10B:
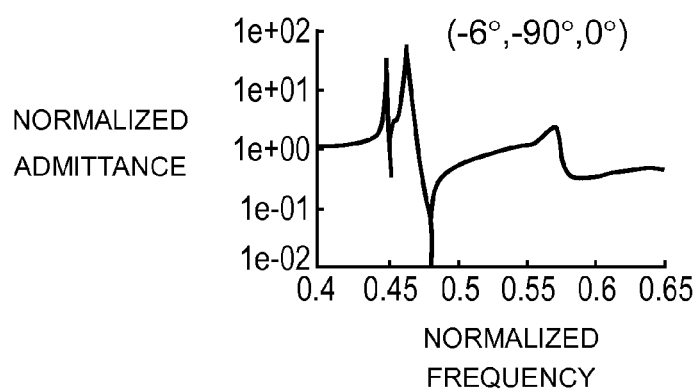
FIG. 10B is a diagram showing the admittance characteristic in the case where φ=−6° in the first filter in the antenna duplexer according to the first embodiment of the invention.
Figure 10C:
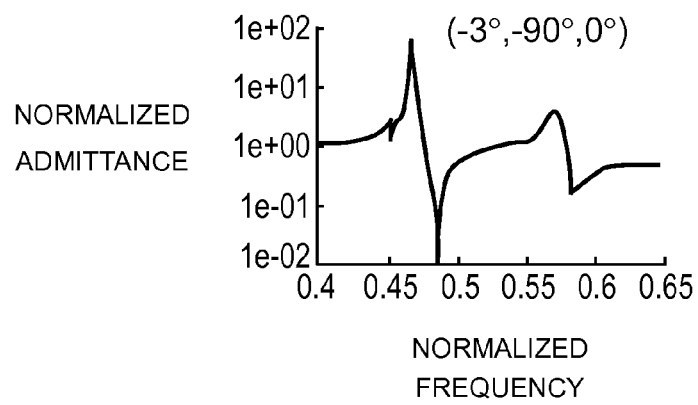
FIG. 10C is a diagram showing the admittance characteristic in the case where φ=−3° in the first filter in the antenna duplexer according to the first embodiment of the invention.
Figure 10D:
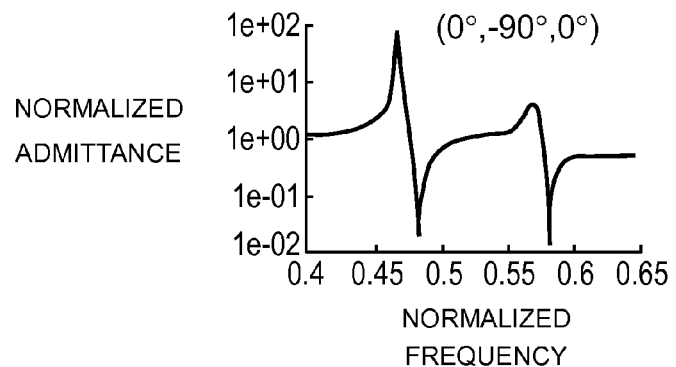
FIG. 10D is a diagram showing the admittance characteristic in the case where φ=0° in the first filter in the antenna duplexer according to the first embodiment of the invention.
Figure 10E:
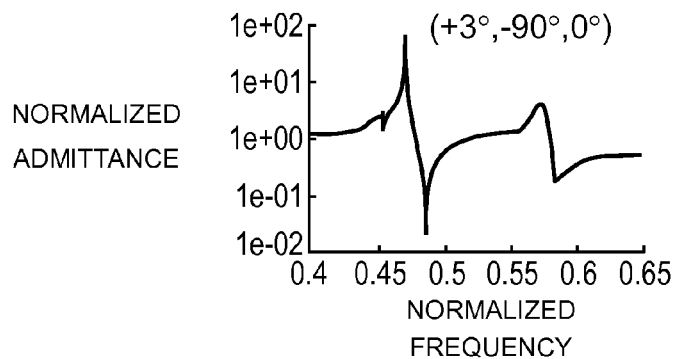
FIG. 10E is a diagram showing the admittance characteristic in the case where φ=+3° in the first filter in the antenna duplexer according to the first embodiment of the invention.
Figure 10F:
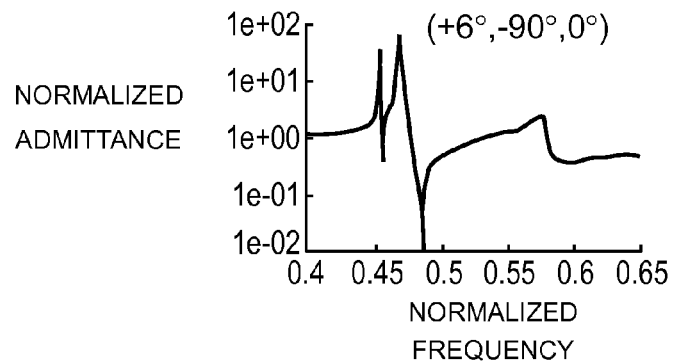
FIG. 10F is a diagram showing the admittance characteristic in the case where φ=+6° in the first filter in the antenna duplexer according to the first embodiment of the invention.
Figure 10G:
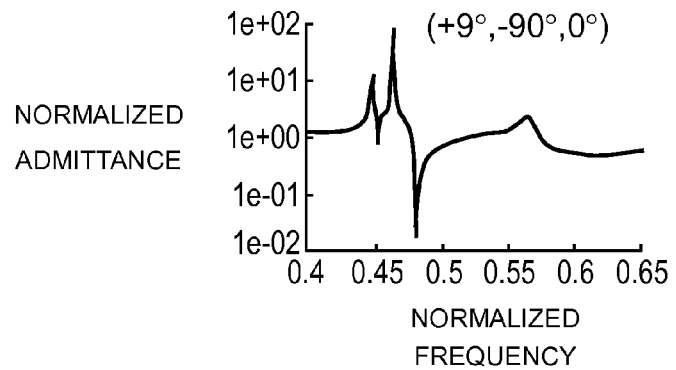
FIG. 10G is a diagram showing the admittance characteristic in the case where φ=+9° in the first filter in the antenna duplexer according to the first embodiment of the invention.
Figure 11A:
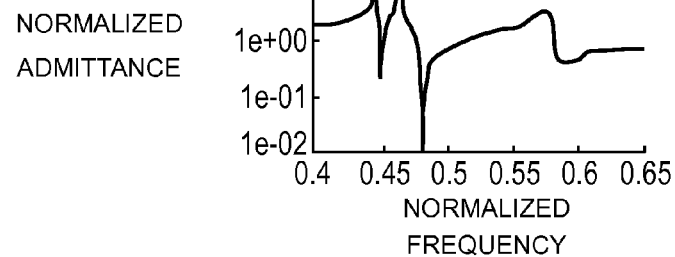
FIG. 11A is a diagram showing the admittance characteristic in the case where ψ=−9° in the first filter in the antenna duplexer according to the first embodiment of the invention.
Figure 11B:
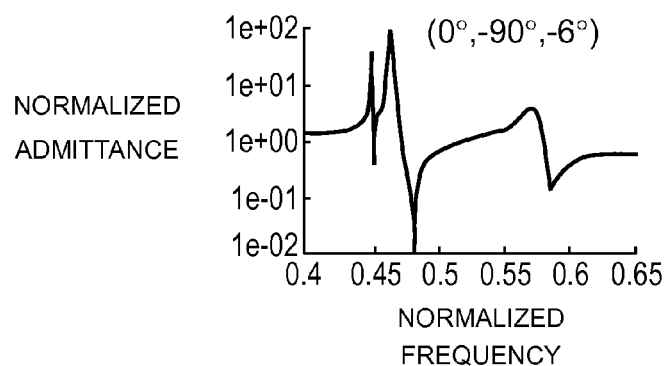
FIG. 11B is a diagram showing the admittance characteristic in the case where ψ=−6° in the first filter in the antenna duplexer according to the first embodiment of the invention.
Figure 11C:
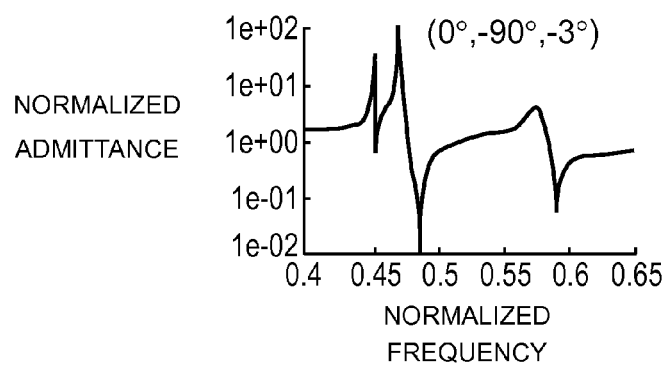
FIG. 11C is a diagram showing the admittance characteristic in the case where ψ=−3° in the first filter in the antenna duplexer according to the first embodiment of the invention.
Figure 11D:
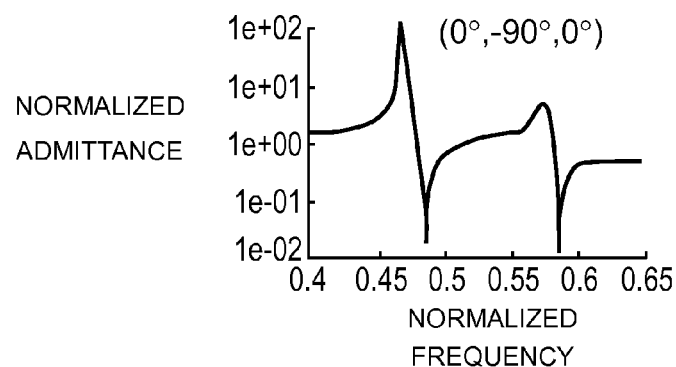
FIG. 11D is a diagram showing the admittance characteristic in the case where ψ=0° in the first filter in the antenna duplexer according to the first embodiment of the invention.
Figure 11E:
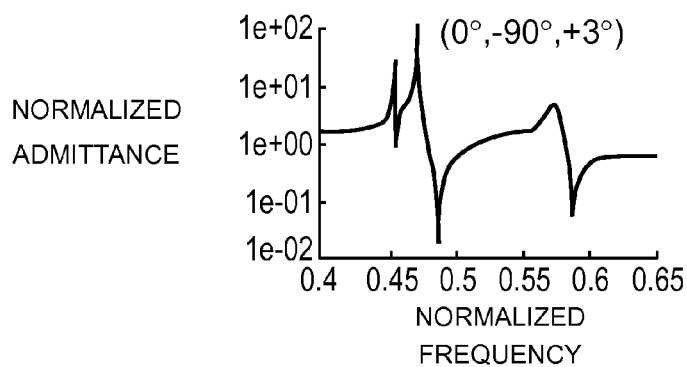
FIG. 11E is a diagram showing the admittance characteristic in the case where ψ=+3° in the first filter in the antenna duplexer according to the first embodiment of the invention.
Figure 11F:
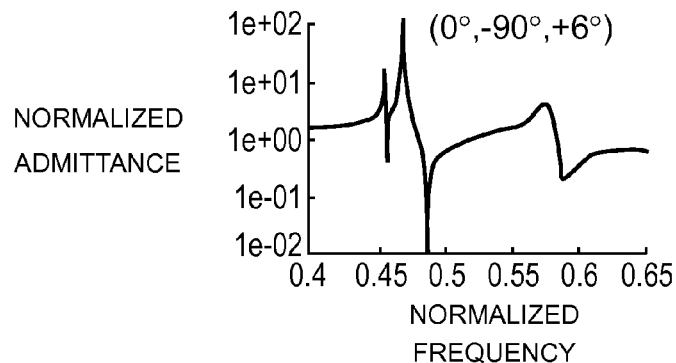
FIG. 11F is a diagram showing the admittance characteristic in the case where ψ=+6° in the first filter in the antenna duplexer according to the first embodiment of the invention.
Figure 11G:
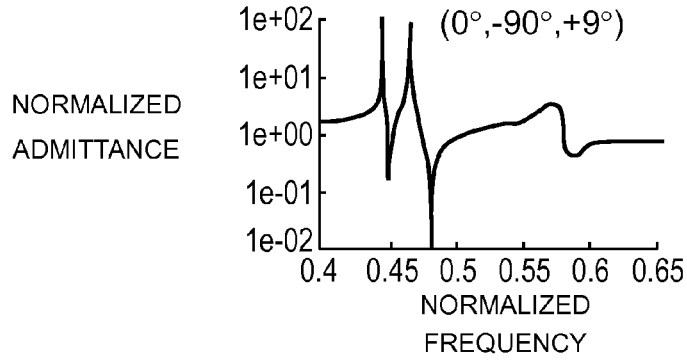
FIG. 11G is a diagram showing the admittance characteristic in the case where ψ=+9° in the first filter in the antenna duplexer according to the first embodiment of the invention.

FIG. 9A is a diagram showing the electromechanical coupling coefficient (k2) of a fast transverse wave when thickness of protective film 24 is changed in first filter 3 in antenna duplexer 1 according to the first embodiment of the invention. FIG. 9B is a diagram showing Q factor (Qs) of resonance of a fast transverse wave. FIG. 9C is a diagram showing Q factor (Qa) of antiresonance of a fast transverse wave.

As shown in FIG. 9B, when the thickness of protective film 24 is set to be larger than 0.2λ, the Q factor of resonance of the fast transverse wave increases. As shown in FIG. 9C, when the thickness of protective film 24 is set to be larger than 0.27λ, the Q factor of antiresonance of the fast transverse wave also increases.

Conventionally, there is a problem such that an unnecessary spurious signal is generated due to the fast transverse wave and the characteristic quality of a filter to which a resonator is applied or an antenna duplexer deteriorates.

An example of changing φ and ψ in the Euler angles (φ, θ, ψ) of piezoelectric body 23 in order to suppress the unnecessary spurious signal due to the fast transverse wave will now be described.

FIGS. 10A to 10G are diagrams showing the admittance characteristic in the case of changing φ in first filter 3 in antenna duplexer 1 according to the first embodiment of the invention. FIGS. 11A to 11G are diagrams showing the admittance characteristic in the case of changing ψ. In FIGS. 10A to 10G and FIGS. 11A to 11G, the admittance characteristic in the case of $1e^{+02}$ or larger and that in the case of $1e^{-02}$ or less are not shown.

FIGS. 10A to 10G and FIGS. 11A to 11G are characteristic diagrams showing the case where piezoelectric body 23 is made of lithium niobate based body having the Euler angles (0°, −90°, 0°), electrode 25 is made of aluminum having a thickness of 0.08λ, and protective film 24 is made of silicon oxide having a thickness of 0.35λ and has the above-described projection in its top face above the electrode finger of electrode 25.

In an upper part of each of FIGS. 10A to 10G and FIGS. 11A to 11G, the Euler angles (φ, θ, ψ) of piezoelectric body 23 are shown. For example, also in the case of changing φ as shown in FIGS. 10A to 10G and also in the case of changing ψ as shown in FIGS. 11A to 11G, the unnecessary spurious signal can be suppressed. However, in those cases, a different unnecessary spurious signal is generated in a frequency band slightly lower than the resonance frequency. It is considered that the unnecessary spurious signal is caused by the Rayleigh wave.

Consequently, an examination was made to suppress generation of the unnecessary spurious signal due to the Rayleigh wave and also suppress the unnecessary spurious signal due to the fast transverse wave in the case where the thickness of protective film 24 in first filter 3 is larger than 0.27λ.

Concretely, first filter 3 in antenna duplexer 1 has a configuration including piezoelectric body 23 made of a lithium niobate based body material having Euler angles (φ, θ, ψ), electrode 25 provided on piezoelectric body 23 and exciting a main elastic wave having wavelength λ, and protective film 24 provided on piezoelectric body 23 so as to cover electrode 25 and thicker than 0.27λ. It is constructed so that the Euler angles of piezoelectric body 23 satisfy −100°≤θ≤−60°, 1.193φ−2°≤ψ≤1.193φ+2°, ψ≤−2φ−3°, and −2φ+3°≤ψ.

As described above, φ and ψ in the Euler angles (φ, θ, ψ) of piezoelectric body 23 are set to predetermined angles or larger and changed so as to follow the relation of ψ=1.193φ to a certain degree. By the operation, while suppressing generation of unnecessary spurious signals caused by the Rayleigh wave, unnecessary spurious signals around a frequency band in which a fast transverse wave is generated can be also suppressed.

Preferably, the upper limit of thickness of protective film 24 is set to 0.5λ so that the electromechanical coupling coefficient of the fast transverse wave becomes a predetermined level.

Figure 12A:
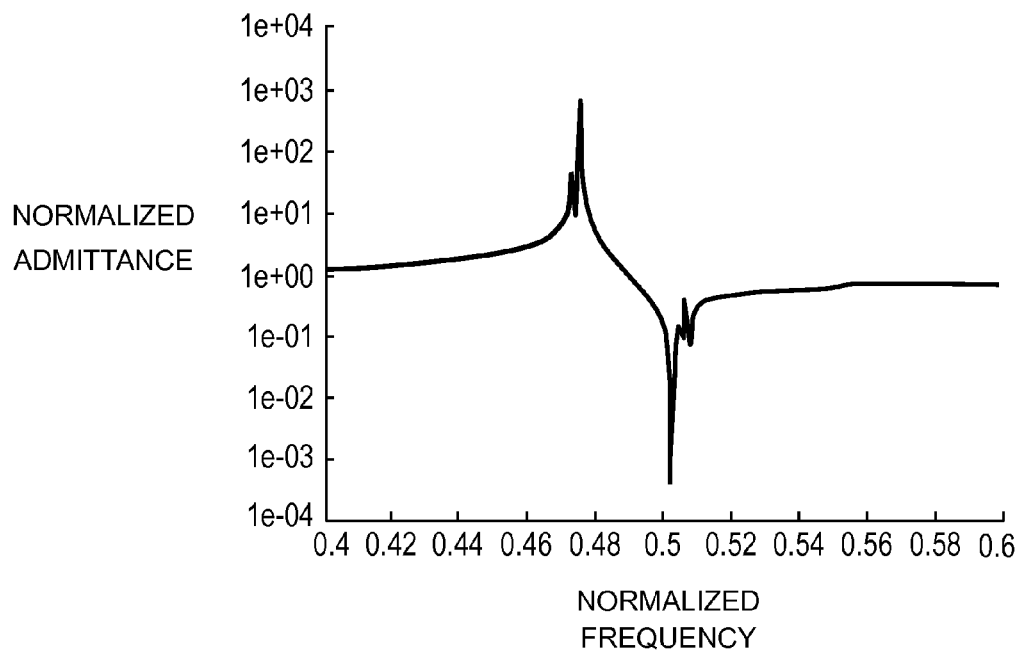
FIG. 12A is an admittance characteristic diagram of a group of the other resonators in the case where, in a first filter in the antenna duplexer according to the first embodiment of the invention, a piezoelectric body is lithium niobate based body having Euler angles (7°, −87.5°, 8.4°), an electrode is made of copper having thickness of 0.03λ, and a protective film is made of silicon oxide, whose top face is flat, and having a thickness of 0.35λ.
Figure 12B:
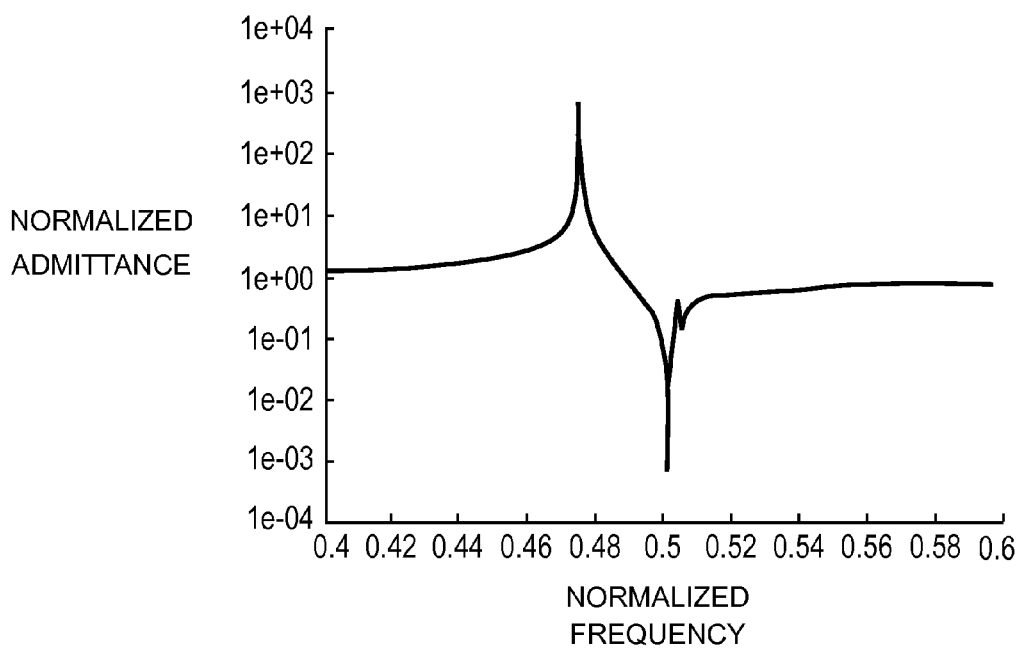
FIG. 12B is an admittance characteristic diagram showing the case where, in the first filter in the antenna duplexer according to the first embodiment of the invention, a piezoelectric body is lithium niobate based body having Euler angles (9°, −87.5°, 10.7°).

FIG. 12A is a characteristic diagram of group 38 of the other resonators in the case where, in first filter 3 in antenna duplexer 1 according to the first embodiment of the invention, piezoelectric body 23 is made of a lithium niobate based body having Euler angles (7°, −87.5°, 8.4°), electrode 25 is made of copper having thickness of 0.03λ, and protective film 24 is made of silicon oxide, whose top face is flat, and having a thickness of 0.35λ. FIG. 12B is a characteristic diagram showing the case where piezoelectric body 23 is made of a lithium niobate based body having Euler angles (9°, −87.5°, 10.7°).

As shown in FIGS. 12A and 12B, in group 38 of the other resonators in first filter 3 having such a configuration, while suppressing generation of unnecessary spurious signals due to the Rayleigh wave, unnecessary spurious signals around a frequency band in which a fast transverse wave is generated can be also suppressed.

Figure 13:
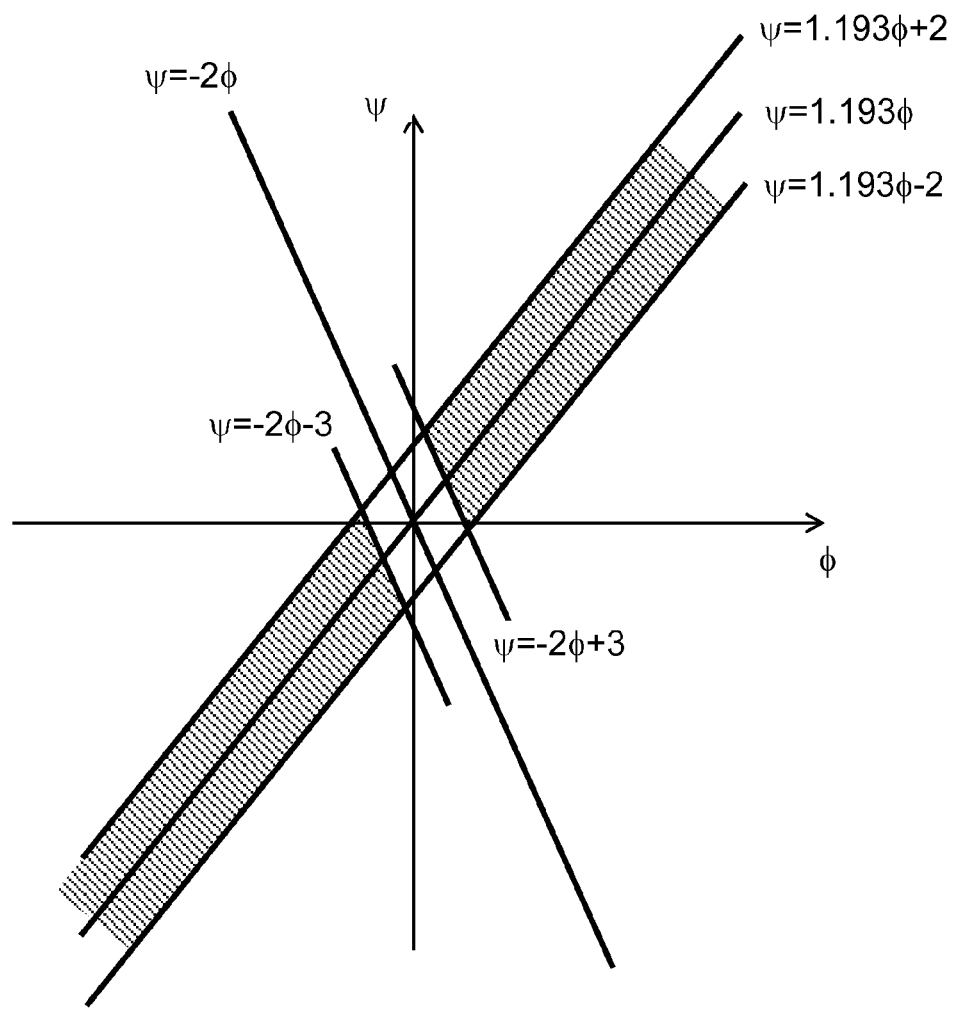
FIG. 13 is a diagram showing a desirable range of φ and ψ in the Euler angles (φ, θ, ψ) of the first filter in the antenna duplexer according to the first embodiment of the invention.

FIG. 13 is a diagram showing a desirable range of φ and ψ in the Euler angles (φ, θ, ψ) of first filter 3 in antenna duplexer 1 according to the first embodiment of the invention.

In FIG. 13, desirable ranges of φ and ψ in the Euler angles (φ, θ, ψ) of piezoelectric body 23 made of a lithium niobate based body are shown by oblique lines. In this example, −100°≤θ≤−60°, the thickness of protective film 24 is set larger than 0.27λ, and electrode 25 is made of copper having normalized thickness of 0.03λ.

The straight line of ψ=1.193φ shown in FIG. 13 shows the relation of φ and ψ in the case where the unnecessary spurious signal caused by the Rayleigh wave is suppressed most. By setting the range of ψ to be within ±2 degrees around the line as a center, that is, the range of 1.193φ−2°≤ψ≤1.193φ+2°, the unnecessary spurious signal caused by the Rayleigh wave can be suppressed.

Figure 14:
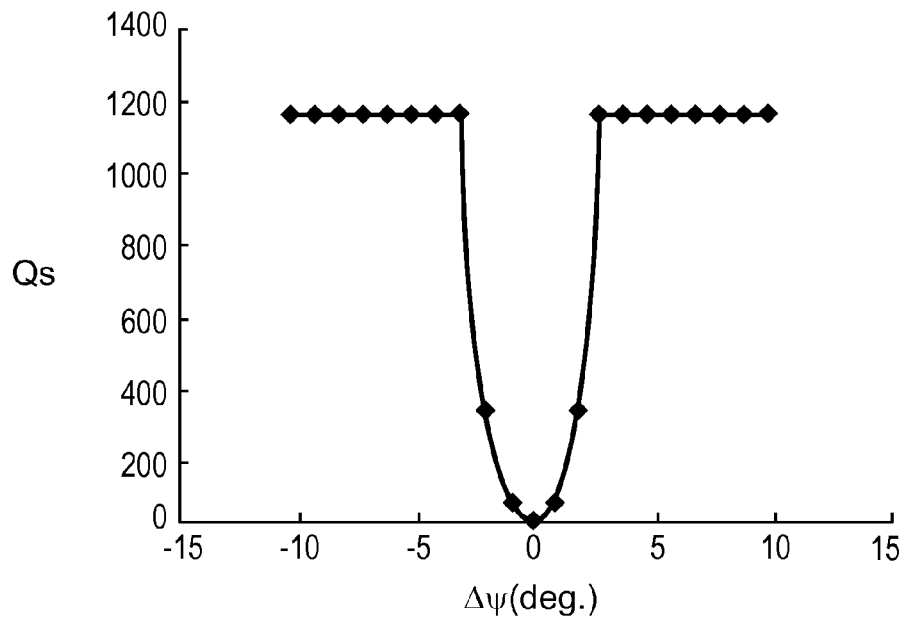
FIG. 14 is a diagram showing Q factor of Rayleigh wave of a group of the other resonators in the case where ψ in the Euler angles (φ, θ, ψ) of the piezoelectric body is changed around ψ=1.193φ, in the first filter in the antenna duplexer according to the first embodiment of the invention.

FIG. 14 is a diagram showing Q factor of Rayleigh wave of group 38 of the other resonators in the case where ψ in the Euler angles (φ, θ, ψ) of piezoelectric body 23 is changed around ψ=1.193φ, in first filter 3 in antenna duplexer 1 according to the first embodiment of the invention. The vertical axis indicates the Q factor (Qs) of the Rayleigh wave, and the horizontal axis indicates a change amount Δψ from the relation of ψ=1.193φ. As shown in FIG. 14, in the range of ±2 degrees of ψ=1.193φ in the Euler angles (φ, θ, ψ) of piezoelectric body 23, the Q factor of the Rayleigh wave of group 38 of the other resonators can be suppressed to a predetermined level or less.

Referring again to FIG. 13, the straight line satisfying the relation of ψ=−2φ shows the relation of φ and ψ in the case where the largest unnecessary spurious signal caused by the fast transverse is generated. By setting the range of ψ to be equal to or larger than ±3 degrees around the line as a center, that is, the ranges of ψ≤−2φ−3° and −2φ+3°≤ψ, the unnecessary spurious signal caused by the fast transverse wave can be suppressed.

Figure 15:
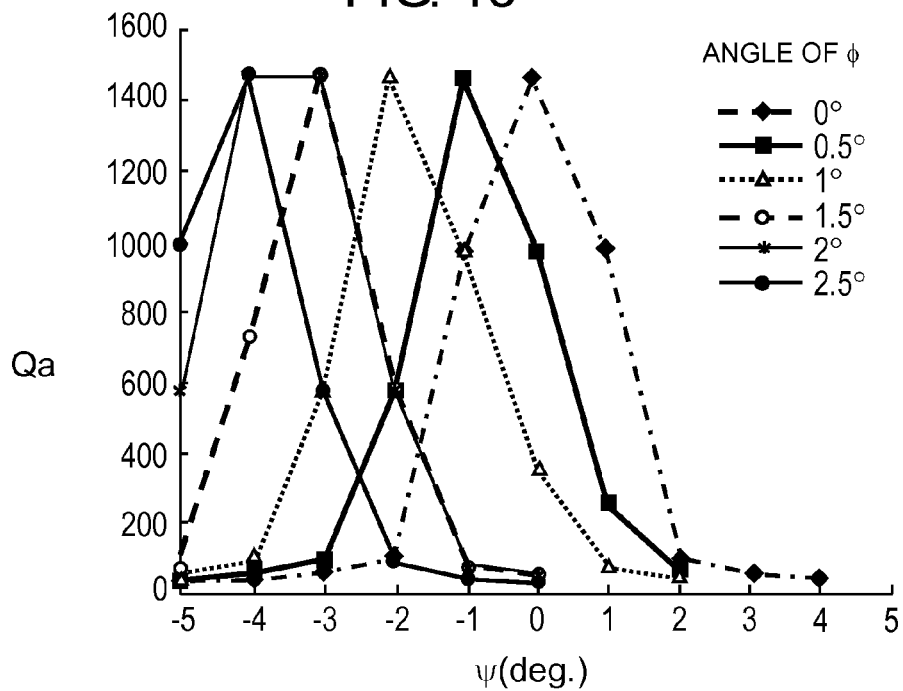
FIG. 15 is a diagram showing Q factor of a fast transverse wave of a group of the other resonators in the case where ψ in the Euler angles (φ, θ, ψ) of the piezoelectric body of the first filter is changed around ψ=−2φ, in the antenna duplexer according to the first embodiment of the invention.

FIG. 15 is a diagram showing the Q factor of the fast transverse wave of group 38 of the other resonators in the case where ψ in the Euler angles (φ, θ, ψ) of piezoelectric body 23 of first filter 3 is changed around the relation of ψ=−2φ, in antenna duplexer 1 according to the first embodiment of the invention. In FIG. 15, ψ in the Euler angles (φ, θ, ψ) of piezoelectric body 23 is changed around the relation of ψ=−2φ, and Q factors of the fast transverse wave when φ=0°, 0.5°, 1°, 1.5°, 2°, and 2.5°.

As shown in FIG. 15, in the range of ±3 degrees or larger from ψ=−2φ+3° in the Euler angles (φ, θ, ψ) of piezoelectric body 23, the Q factor of the fast transverse wave of group 38 of the other resonators can be suppressed to a predetermined level or less.

Figure 16:
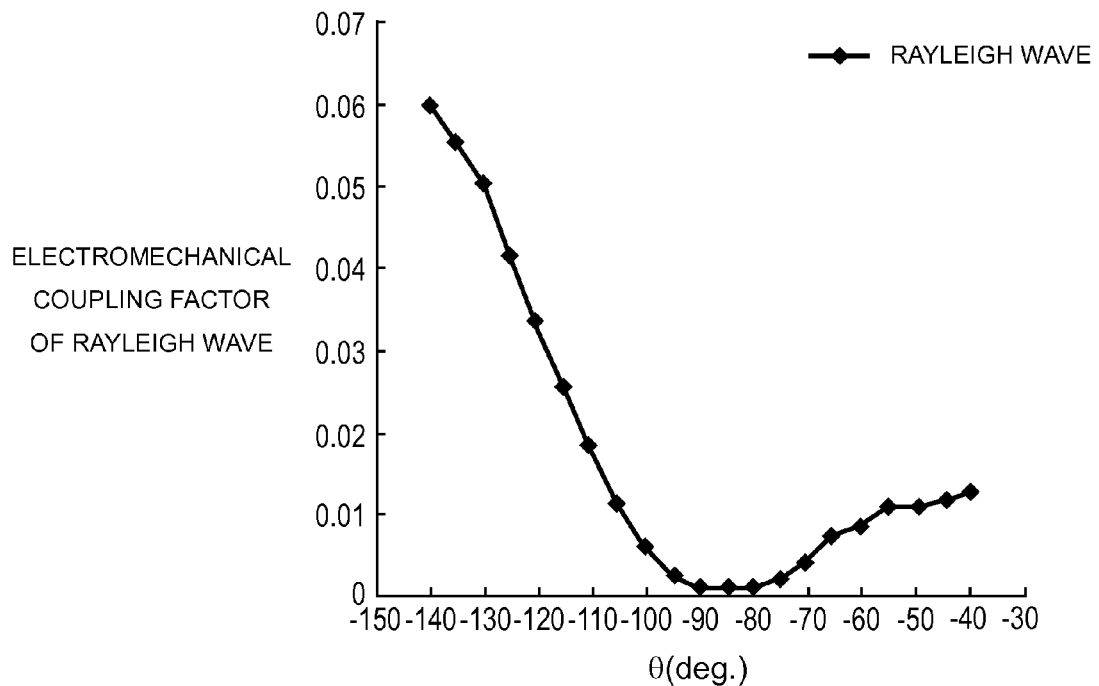
FIG. 16 is a diagram showing electromechanical coupling coefficient (k2) of Rayleigh wave of a group of the other resonators in the case where θ in the Euler angles (φ, θ, ψ) of the first filter is changed, in the antenna duplexer according to the first embodiment of the invention.

FIG. 16 is a diagram showing electromechanical coupling coefficient (k2) of the Rayleigh wave of group 38 of the other resonators in the case where θ in the Euler angles (φ, θ, ψ) of piezoelectric body 23 in first filter 3 is changed, in antenna duplexer 1 according to the first embodiment of the invention. As shown in FIG. 16, to suppress the electromechanical coupling coefficient of the Rayleigh wave to 0.01 or less, θ in the Euler angles (φ, θ, ψ) of piezoelectric body 23 has to satisfy the relation of −100°≤θ≤−60°.

Figure 17:
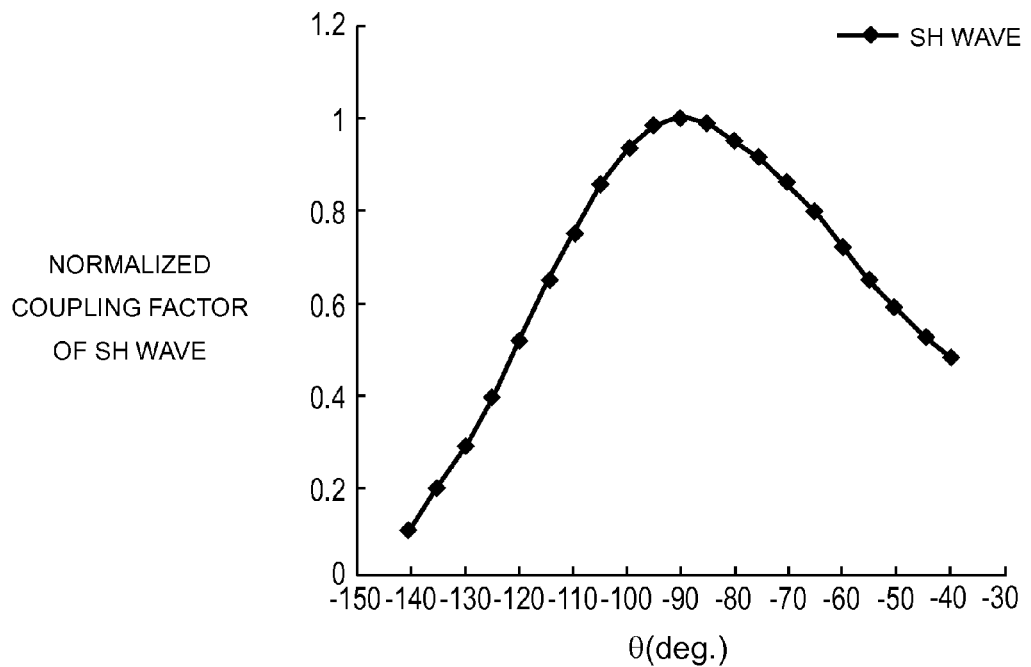
FIG. 17 is a diagram showing normalization coupling coefficient of SH wave of a group of the other resonators in the case where θ in the Euler angles (φ, θ, ψ) of the piezoelectric body in the first filter is changed, in the antenna duplexer according to the first embodiment of the invention.

FIG. 17 is a diagram showing the normalized coupling coefficient of SH wave of group 38 of the other resonators in the case where θ in the Euler angles (φ, θ, ψ) of piezoelectric body 23 in first filter 3 is changed, in antenna duplexer 1 according to the first embodiment of the invention. The normalized coupling coefficient is a value obtained by normalizing the value of the electromechanical coupling coefficient with the value of the electromechanical coupling coefficient of the case of θ=−90°. As shown in FIG. 17, when θ in the Euler angles (φ, θ, ψ) of piezoelectric body 23 is in the range of −110°≤θ≤−60° including the range of −100°≤θ−60°, the electromechanical coupling coefficient (k2) of the SH wave is equal to or larger than a predetermined value.

Figure 18:
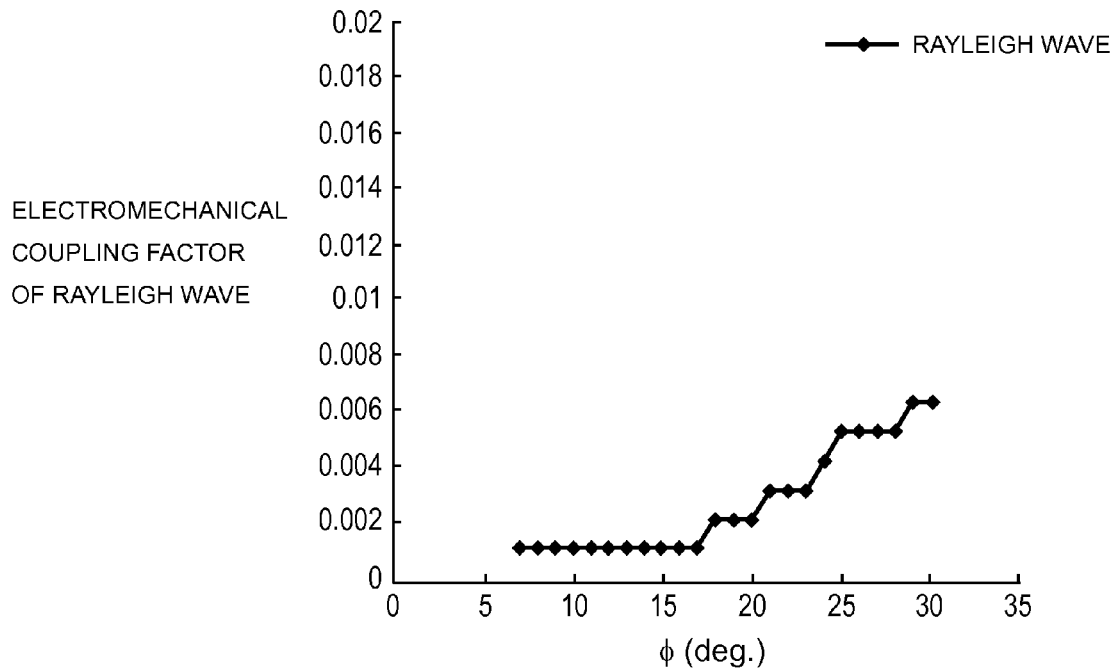
FIG. 18 is a diagram showing electromechanical coupling coefficient (k2) of Rayleigh wave of a group of the other resonators in the case where φ in the Euler angles (φ, θ, ψ) of the piezoelectric body in the first filter is changed according to the relation of ψ=1.193φ, in the antenna duplexer according to the first embodiment of the invention.

FIG. 18 is a diagram showing the electromechanical coupling coefficient (k2) of the Rayleigh wave of group 38 of the other resonators in the case where φ in the Euler angles (φ, θ, ψ) of piezoelectric body 23 in first filter 3 is changed according to the relation of ψ=1.193φ, in antenna duplexer 1 according to the first embodiment of the invention. As shown in FIG. 18, in the range of φ≤20°, the electromechanical coupling coefficient of the Rayleigh wave can be suppressed to about 0.002 or less which is lower than the above-described value 0.01. Also in the case of changing the Euler angles of piezoelectric body 23 in the negative direction with respect to φ, a similar result can be obtained. That is, under the above-described condition, preferably, φ in the Euler angles (φ, θ, ψ) of piezoelectric body 23 in first filter 3 satisfies the relation of |φ|≤20°. Consequently, the electromechanical coefficient of the Rayleigh wave can be further suppressed.

Figure 19:
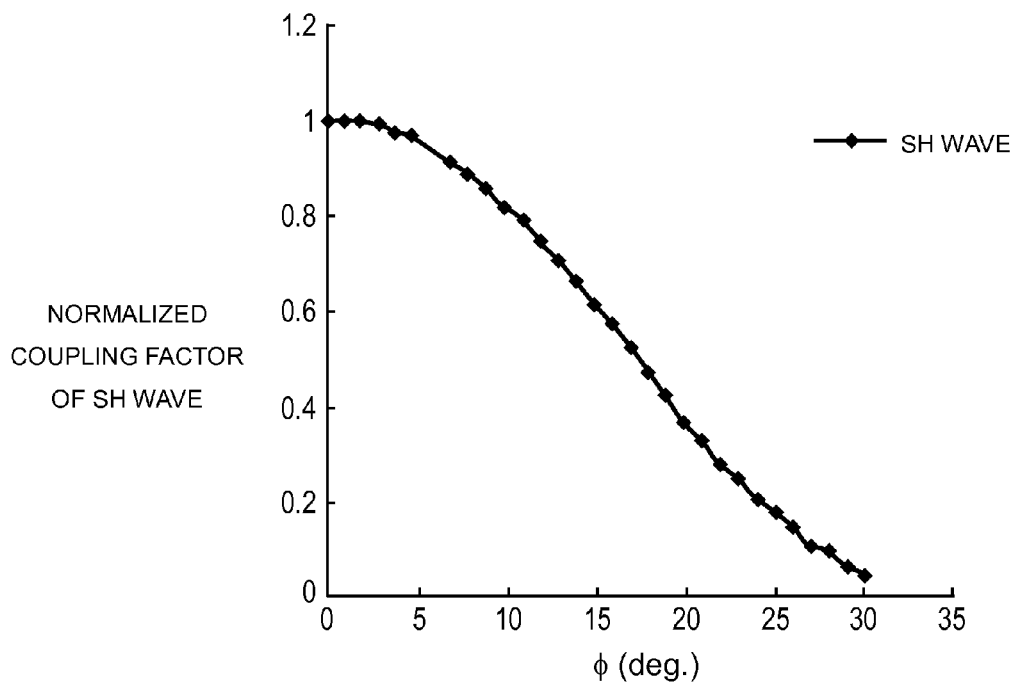
FIG. 19 is a diagram showing normalization coupling coefficient of the SH wave of a group of the other resonators in the case where φ in the Euler angles (φ, θ, ψ) of the piezoelectric body in the first filter is changed according to the relation of ψ=1.193φ, in the antenna duplexer according to the first embodiment of the invention.

FIG. 19 is a diagram showing the normalized coupling coefficient of the SH wave of group 38 of the other resonators in the case where φ in the Euler angles (φ, θ, ψ) of piezoelectric body 23 in first filter 3 is changed according to the relation of ψ=1.193φ, in antenna duplexer 1 according to the first embodiment of the invention. FIG. 19 shows the case where the Euler angles of piezoelectric body 23 with respect to φ are turned in the positive direction. Also in the case of turning the Euler angles of piezoelectric body 23 with respect to φ in the negative direction, a similar result can be obtained. As shown in FIG. 19, from the viewpoint of the SH wave as the main elastic wave, when φ in the Euler angles (φ, θ, ψ) of piezoelectric body 23 satisfies the relation of |φ|≤20°, the electromechanical coupling coefficient of the SH wave of the predetermined value or larger can be obtained.

In the embodiment, the case of using lithium niobate based body having the Euler angles in the above-described predetermined range as piezoelectric body 23 has been described. The antenna duplexer of the present invention is not limited to the example. For example, lithium niobate based body or lithium tantalate having the Euler angles out of the specific range can be also used.

The above-described main elastic wave can be applied as both a surface acoustic wave and a boundary acoustic wave which propagates in the surface of piezoelectric body 23. For example, when the thickness of protective film 24 is set to λ or larger, the main elastic wave becomes the boundary acoustic wave.

The embodiment has been described using the example of making the antiresonance frequency of second series resonator 7 lower than that of first, third, and fourth series resonators 6, 8, and 9. The present invention, however, is not limited to the example. For example, the antiresonance frequency of first series resonator 6 disposed closest to input terminal 5 may be lower than that of second, third, and fourth series resonators 7, 8, and 9. With the configuration, the width of the electrode finger of first series resonator 6 closest to the side of input terminal 5 can be widened most. Therefore, antenna duplexer having excellent power durability can be provided.

Second Exemplary Embodiment

A second exemplary embodiment of the present invention will now be described.

Figure 20:
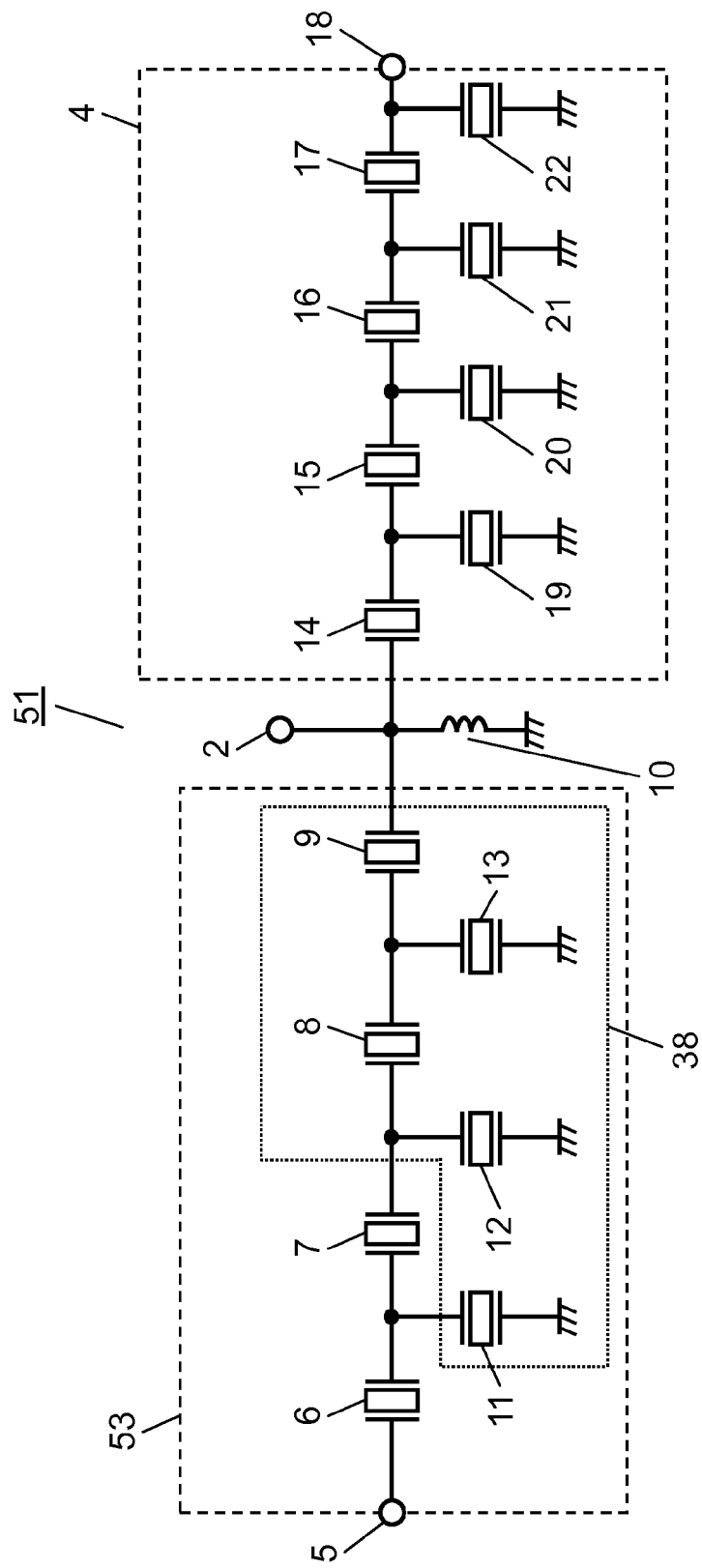
FIG. 20 is a schematic circuit diagram of an antenna duplexer in a second exemplary embodiment of the invention.

FIG. 20 is a schematic circuit diagram of antenna duplexer 51 in the second exemplary embodiment of the invention.

Figure 21:
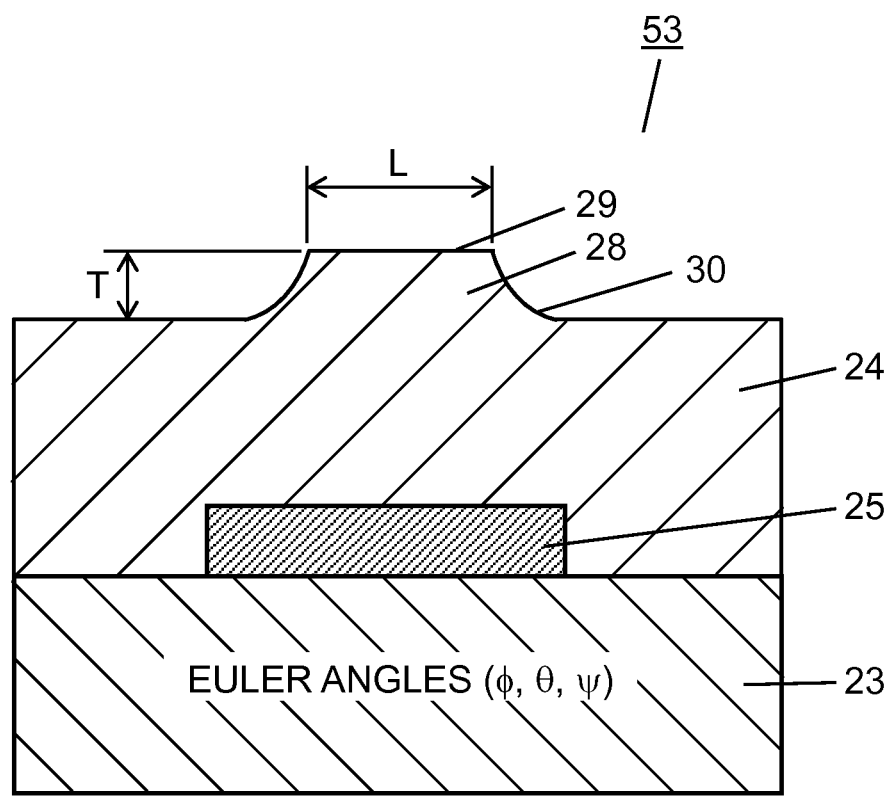
FIG. 21 is a schematic cross section of a first filter in the antenna duplexer in the second exemplary embodiment of the invention.

FIG. 21 is a schematic cross section of first filter 53 in antenna duplexer 51 in the second exemplary embodiment of the invention. Antenna duplexer 51 in the embodiment has, like antenna duplexer 1 shown in FIG. 1, first filter 53 and second filter 4. Unless otherwise specially described, the configuration of first filter 53 is similar to that of first filter 3 of the first embodiment.

First filter 53 in the embodiment has piezoelectric body 23 made of a lithium niobate based body having the Euler angles (φ, θ, ψ), electrode 25 provided on piezoelectric body 23 and exciting the main elastic wave having wavelength λ, and protective film 24 formed on piezoelectric body 23 so as to cover electrode 25 and having thickness larger than 0.2λ.

Protective film 24 has projection 28 above the electrode finger of electrode 25 in a section in the direction orthogonal to the extension direction of the electrode finger of electrode 25. The width of top part 29 of projection 28 is smaller than that of the electrode finger of electrode 25.

The Euler angles of piezoelectric body 23 satisfy the relations of −100°≤θ≤−60°, 1.193φ−2°≤ψ≤1.193φ+2°, ψ≤−2φ−3°, and −2φ+3°≤ψ.

In the case where protective film 24 has projection 28 like the configuration shown in FIG. 21, the unnecessary spurious signal caused by the fast transverse wave becomes an issue. The case of setting the thickness of protective film 24 made of, for example, silicon oxide to be larger than 0.2λ in order to improve the frequency temperature characteristic of first filter 53 is assumed. In this case as well, when φ and ψ in the Euler angles (φ, θ, ψ) of piezoelectric body 23 are set to predetermined angle or larger and changed so as to follow the relation of ψ=1.193φ to a certain degree, while suppressing generation of unnecessary spurious signals caused by the Rayleigh wave, unnecessary spurious signals around a frequency band in which a fast transverse wave is generated can be also suppressed.

Figure 22A:
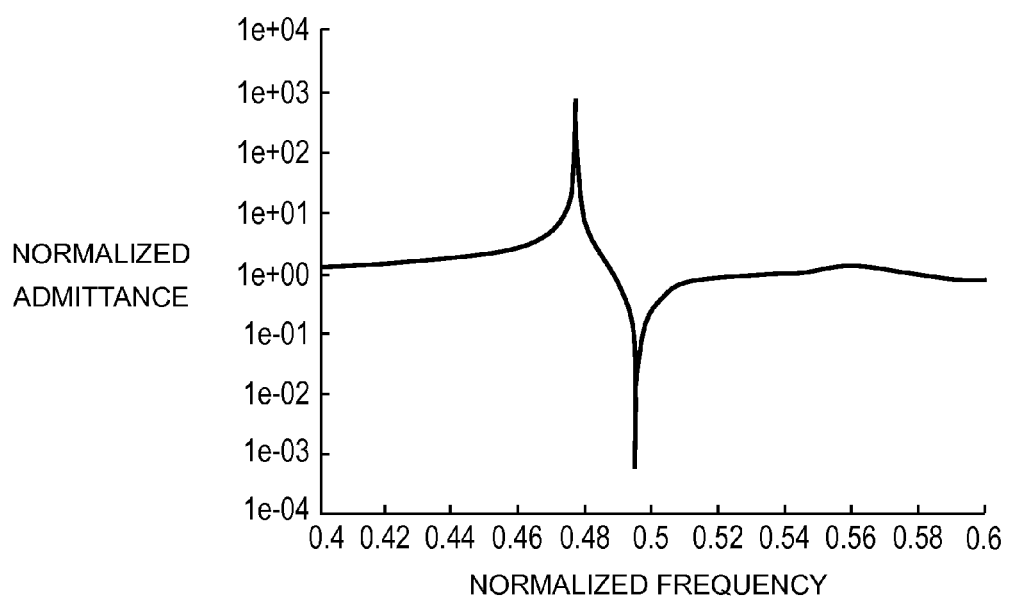
FIG. 22A is an admittance characteristic diagram of a group of the other resonators in the case where a piezoelectric body of the first filter in the antenna duplexer according to the second embodiment of the invention is lithium niobate based body having Euler angles (7°, −87.5°, 8.4°), an electrode is made of aluminum having a thickness of 0.08λ, and a protective film is made of silicon oxide, has a film thickness of 0.35λ, and has a projection having a height T=0.08λ on its top face.
Figure 22B:
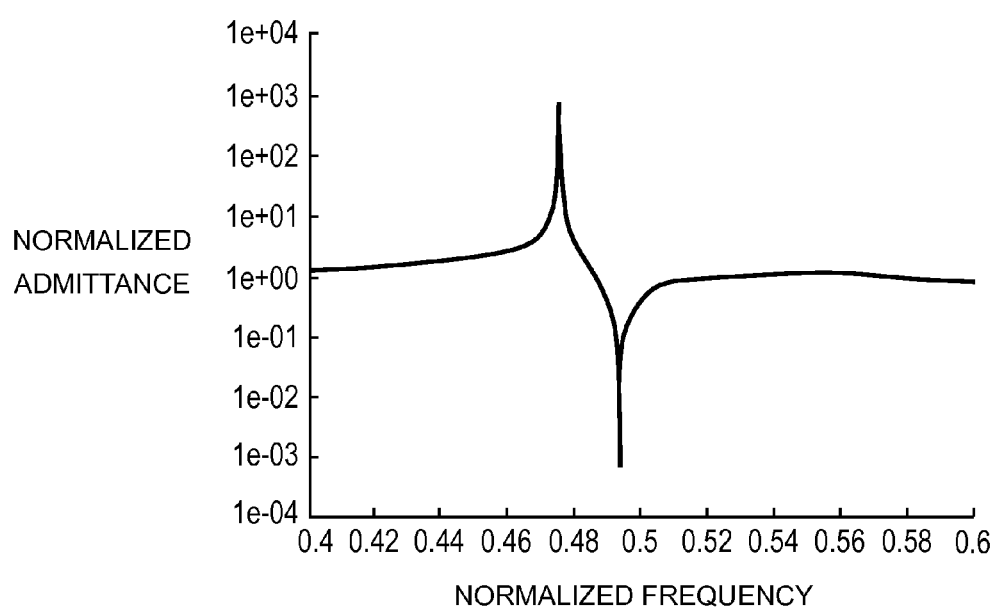
FIG. 22B is an admittance characteristic diagram in the case where the piezoelectric body of the first filter in the antenna duplexer according to the second embodiment of the invention is lithium niobate based body having Euler angles (9°, −87.5°, 10.7°).

FIG. 22A is a characteristic diagram of group 38 of the other resonators in the case where piezoelectric body 23 of first filter 53 in the antenna duplexer according to the second embodiment of the invention is made of lithium niobate based body having Euler angles (7°, −87.5°, 8.4°), electrode 25 is made of aluminum having a thickness of 0.08λ, and protective film 24 is made of silicon oxide having a film thickness of 0.35λ and has a projection having a height T=0.08λ on its top face. FIG. 22B is a characteristic diagram in the case where piezoelectric body 23 is lithium niobate based body having Euler angles (9°, −87.5°, 10.7°).

As shown in FIGS. 22A and 22B, in first filter 53 of the embodiment, while suppressing generation of unnecessary spurious signals caused by the Rayleigh wave, unnecessary spurious signals around a frequency band in which a fast transverse wave is generated can be also suppressed.

Preferably, projection 28 in protective film 24 has a curved shape which is projected downward from top part 29 of projection 28 to lowest part 30. In this case, width L of top part 29, defined by the distance between points at which the downwardly projected curved lines or extension lines of the curved lines and a straight line parallel to the top face of piezoelectric body 23 including top part 29 cross each other, is set to be smaller than the width of the electrode finger of electrode 25. Consequently, mass addition of protective film 24 in projection 28 changes continuously and gently. As a result, while suppressing generation of unnecessary reflection caused by the shape of protective film 24, electric characteristics of first filter 53 can be improved.

Preferably, the width of top part 29 of projection 28 is set to be equal to or less than ½ of the width of the electrode finger of electrode 25. Preferably, a center position of top part 29 substantially corresponds to a position above the center position of the electrode finger. With the configuration, reflectance in the electrode finger is further increased by the mass addition effect, and the electric characteristics of first filter 53 can be improved.

Further, when a height of projection 28 is T and a film thickness of electrode 25 is h, preferably, the relation of $0.03\lambda < T \leq h$ is satisfied. In an examination of the relation between height T from lowest part 30 to top part 29 of projection 28 in protective film 24 and the electric characteristics, when T is set to be larger than $0.03\lambda$, improvement in reflectance is larger than that in the case where the surface of protective film 24 is flat. On the other hand, when height T is set larger than film thickness h of electrode 25, at the time of manufacturing (which will be described later), a new step to generate protective film 24 has to be added, and a manufacturing method becomes complicated. Consequently, it is desirable to set height T to be equal to or less than film thickness h.

A method of manufacturing first filter 53 in the second embodiment of the invention will now be described.

FIGS. 23A to 23H are diagrams showing an example of a method of manufacturing first filter 53 in the antenna duplexer according to the second embodiment of the invention.

Figure 23A:
FIG. 23A is a diagram showing an example of a method of manufacturing a first filter in an antenna duplexer according to the second embodiment of the invention.

First, as shown in FIG. 23A, on the top face of piezoelectric body 31, electrode film 32 which becomes at least one of an electrode and a reflector is formed by Al or Al alloy by a method such as deposition or sputtering.

Figure 23B:
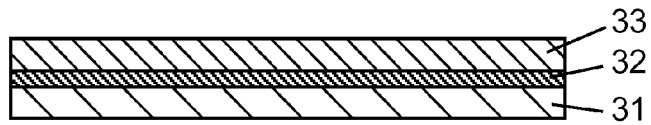
FIG. 23B is a diagram showing an example of the method of manufacturing the first filter in the antenna duplexer according to the second embodiment of the invention.

As shown in FIG. 23B, resist film 33 is formed on the top face of electrode film 32.

Figure 23C:
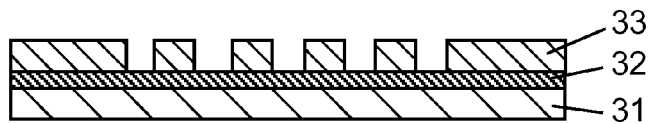
FIG. 23C is a diagram showing an example of the method of manufacturing the first filter in the antenna duplexer according to the second embodiment of the invention.

Further, as shown in FIG. 23C, resist film 33 is processed into a desired shape by using the exposure and development technique or the like.

Figure 23D:
FIG. 23D is a diagram showing an example of the method of manufacturing the first filter in the antenna duplexer according to the second embodiment of the invention.

As shown in FIG. 23D, electrode film 32 is processed in a desired shape such as an IDT electrode, a reflector, or the like by using the dry etching technique or the like. After that, resist film 33 is removed.

Figure 23E:
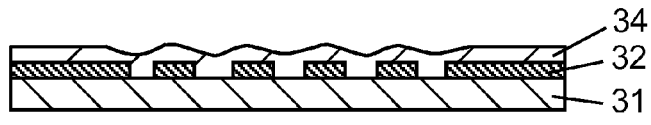
FIG. 23E is a diagram showing an example of the method of manufacturing the first filter in the antenna duplexer according to the second embodiment of the invention.

Next, as shown in FIG. 23E, protective film 34 is formed by a method such as depositing or sputtering silicon oxide so as to cover electrode film 32. As a method of obtaining projection 28 in protective film 34, so-called bias sputtering of forming a film by sputtering while applying bias to the side of piezoelectric body 31 can be used.

By sputtering the target of silicon oxide, protective film 34 is deposited on piezoelectric body 31 and, at the same time, by applying bias, a part of protective film 34 on piezoelectric body 31 is sputtered. That is, by etching a part of protective film 34 while depositing protective film 34, the shape of protective film 34 can be controlled. As means for controlling the shape of protective film 34, the ratio between the bias and sputtering power applied to piezoelectric body 31 may be changed during deposition of protective film 34 or a film is formed without applying bias to piezoelectric body 31 initially and, from a certain time, bias may be applied simultaneously with film deposition. At this time, temperature of piezoelectric body 31 is also controlled.

Figure 23F:
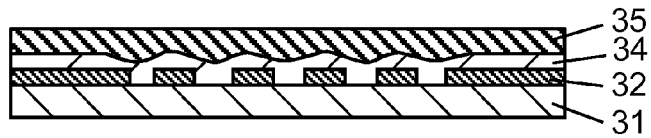
FIG. 23F is a diagram showing an example of the method of manufacturing the first filter in the antenna duplexer according to the second embodiment of the invention.

As shown in FIG. 23F, resist film 35 is formed on the surface of protective film 34.

Figure 23G:
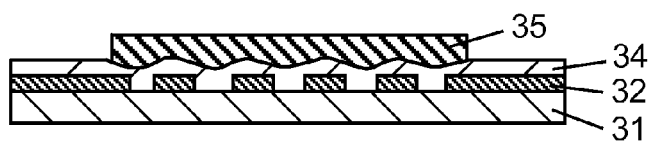
FIG. 23G is a diagram showing an example of the method of manufacturing the first filter in the antenna duplexer according to the second embodiment of the invention.

As shown in FIG. 23G, resist film 35 is processed in a desired shape by using the exposure/development technique or the like.

Figure 23H:
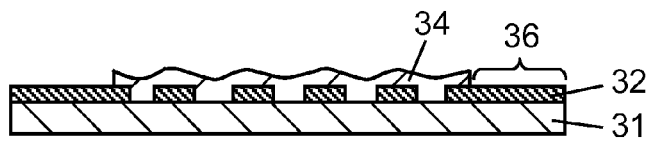
FIG. 23H is a diagram showing an example of the method of manufacturing the first filter in the antenna duplexer according to the second embodiment of the invention.

As shown in FIG. 23H, by using the dry etching technique or the like, protective film 34 in unnecessary parts such as a part of pad 36 for taking an electric signal are removed. After that, resist film 35 is removed.

By dividing the resultant by dicing, antenna duplexer 51 having first filter 53 can be obtained.

By forming protective film 34 under proper film forming conditions by using the bias sputtering method as described above, a desired shape can be obtained.

The characteristics of the group of the other resonators of first filter 53 in the embodiment are similar to those of group 38 of the other resonators of first filter 3 in the first embodiment shown in FIGS. 13 to 19. For example, the case where thickness of protective film 34 made of, for example, silicon oxide is set to be larger than $0.2\lambda$ to improve the frequency temperature characteristics of first filter 53 is assumed. In this case, when $\phi$ and $\psi$ in the Euler angles ($\phi$, $\theta$, $\psi$) of piezoelectric body 31 are set to predetermined angle or larger and changed so as to follow the relation of $\psi = 1.193\phi$ to a certain degree, while suppressing generation of unnecessary spurious signals caused by the Rayleigh wave, unnecessary spurious signals around a frequency band in which a fast transverse wave is generated can be suppressed.

Third Exemplary Embodiment

Next, a third exemplary embodiment of the present invention will be described.

Figure 24:
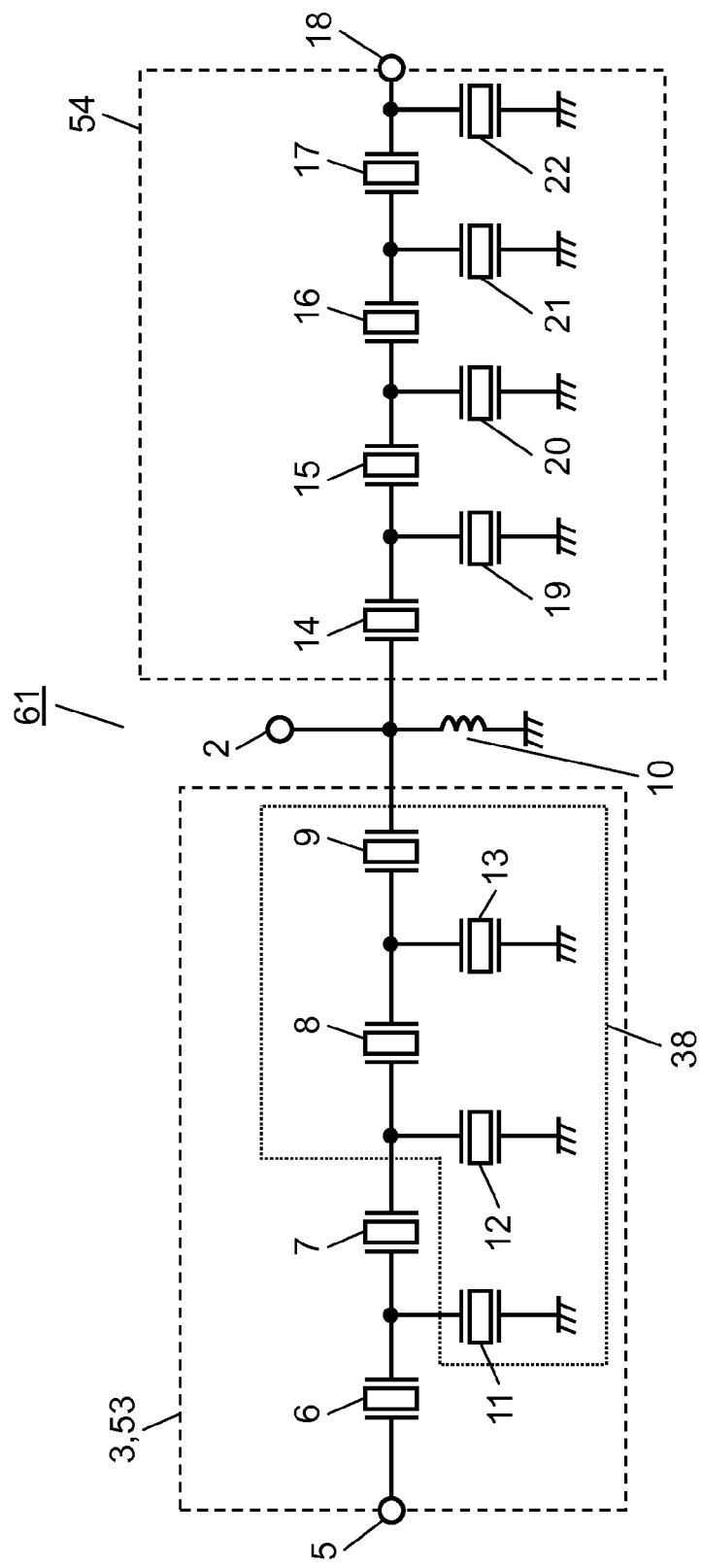
FIG. 24 is a schematic circuit diagram of an antenna duplexer in a third embodiment of the present invention.

FIG. 24 is a schematic circuit diagram of antenna duplexer 61 in the third embodiment of the present invention.

In the embodiment, the configuration of first filters 3 and 53 described in the first and second exemplary embodiments is applied to second filter 54 of antenna duplexer 61.

Concretely, the resonance frequency of fourth parallel resonator 19 in second filter 54 is set to be higher than that of the other parallel resonators, concretely, fifth, sixth, and seventh parallel resonators 20, 21, and 22. The electromechanical coupling coefficient of fourth parallel resonator 19 is set to be smaller than that of fifth, sixth, and seventh parallel resonators 20, 21, and 22. Consequently, the propagation angle $\psi$ of the main elastic wave of fourth parallel resonator 19 is made different from that of the main elastic wave of fifth, sixth, and seventh parallel resonators 20, 21, and 22.

The configuration of piezoelectric body 23, protective film 24, electrode 25, and the like of second filter 54 in antenna duplexer 61 in the third embodiment of the invention are, unless otherwise specially described, similar to that of first filters 3 and 53 in antenna duplexers 1 and 51 in the first and second embodiments.

In the embodiment, an example of changing the propagation angle w in the Euler angles of piezoelectric body 23 in fourth parallel resonator 19 of second filter 54 will be described. However, the invention is not limited to the example. The propagation angle of not only fourth parallel resonator 19 but also the other resonators may be changed. For example, the electromechanical coupling coefficient of fourth and fifth parallel resonators 19 and 20 having the highest resonance frequency among the parallel resonators may be set smaller than that of the other parallel resonators, that is, sixth and seventh parallel resonators 21 and 22. In this case, it is sufficient to make the propagation angle w of the main elastic wave of fourth and fifth parallel resonators 19 and 20 different from that of the main elastic wave of sixth and seventh parallel resonators 21 and 22.

In reception filter 54 in antenna duplexer 61 of the embodiment, by making the propagation angle w of fourth parallel resonator 19 larger than that of fifth, sixth, and seventh parallel resonators 20, 21, and 22, the slope characteristic on the high frequency side of the passband of second filter 54 can be made steep.

As described above, in a manner similar to the description of the first embodiment, second filter 54 in antenna duplexer 61 has protective film 24 formed on piezoelectric body 23 so as to cover electrode 25.

With the configuration, by changing the propagation angle w (propagation direction) of the main elastic wave in the resonator, the electromechanical coupling coefficient of the main elastic wave of the resonator can be largely controlled.

In second filter 54 in antenna duplexer 61 according to the embodiment, by setting the electromechanical coupling coefficient of fourth parallel resonator 19 having the highest resonance frequency which exerts large influence on steepness to be smaller than that of the other parallel resonators, steepness in the crossband can be improved.

By setting the electromechanical coupling coefficient of the other parallel resonators having relatively high resonance frequency which exerts small influence on steepness, that is, fifth, sixth, and seventh parallel resonators 20, 21, and 22 to be larger than that of fourth parallel resonator 19, the passband width can be widened, and a loss in a wider transmission pass band can be suppressed. That is, antenna duplexer 61 of the embodiment can satisfy both steepness in the crossband and lower loss in the transmission passband.

In addition, in comparison of the electromechanical coupling coefficient between a parallel resonator other than fourth parallel resonator 19 having the highest resonance frequency among the plurality of parallel resonators, for example, fifth parallel resonator 20 and a parallel resonator whose resonance frequency is lower than that of fifth parallel resonator 20, the electromechanical coupling coefficient of fifth parallel resonator 20 may be set to be smaller than that of sixth parallel resonator 21. That is, the propagation angle ψ of the main elastic wave of fifth parallel resonator 20 may be made different from that of the main elastic wave of sixth parallel resonator 21. Consequently, both steepness in the crossband and lower loss in the reception passband can be satisfied.

By making the configuration of the transmission filter in antenna duplexer 61 of the embodiment similar to that of transmission filters 3 and 53 described in the first and second embodiments, both steepness in the crossband and lower loss in the transmission/reception passbands can be satisfied. Antenna duplexer 61 of the embodiment, however, is not limited to the example and can use any of various known ladder filters as the transmission filter.

INDUSTRIAL APPLICABILITY

As described above, the antenna duplexer of the present invention has an effect that both steepness in the crossband and lower loss in the passband can be satisfied, and can be applied to an electronic device such as a cellular phone.

REFERENCE MARKS IN THE DRAWINGS 1, 51, 61 antenna duplexer
2 antenna terminal
3, 53 first filter
4, 54 second filter
5 input terminal
6 first series resonator
7 second series resonator
8 third series resonator
9 fourth series resonator
10 phase shifter
11 first parallel resonator
12 second parallel resonator
13 third parallel resonator
14 fifth series resonator
15 sixth series resonator
16 seventh series resonator
17 eighth series resonator
18 output terminal
19 fourth parallel resonator
20 fifth parallel resonator
21 sixth parallel resonator
22 seventh parallel resonator
23, 31 piezoelectric body
24, 34 protective film
25 electrode
28 projection
29 top part
30 lowest part
32 electrode film
33, 35 resist film
36 pad
38 group of other resonators

The invention claimed is:
1. An antenna duplexer comprising:
an input terminal, an output terminal, and an antenna terminal;
a transmission filter passing a signal in a first frequency band and connected between the input terminal and the antenna terminal, the transmission filter including a lithium niobate based piezoelectric body and a protective film formed on the piezoelectric body, the piezoelectric body having Euler angles ($\phi$, $\theta$, $\psi$), the transmission filter being a ladder filter including a plurality of series resonators and a plurality of parallel resonators, each resonator including an electrode formed between the piezoelectric body and the protective film and configured to excite a main elastic wave, the plurality of series resonators including a first series resonator, a second series resonator, and a plurality of additional series resonators, the first series resonator having a lowest antiresonance frequency and being disposed closest to the input terminal among the plurality of series resonators, a propagation angle of a main elastic wave of the first series resonator and a propagation angle of a main elastic wave of the second series resonator being different from each other such that an electromechanical coupling coefficient of the first series resonator is smaller than an electromechanical coupling coefficient of the second series resonator, and the Euler angles in the plurality of additional series resonators and the plurality of parallel resonators satisfying conditions of $-20°\leq\phi\leq20°$, $-100°\leq\theta\leq-60°$, $1.193\phi-2°\leq\psi\leq1.193\phi+2°$, and either $\psi\leq-2\phi-3°$ or $-2\phi+3°\leq\psi$, the conditions simultaneously suppressing spurious transmissions derived from a Rayleigh wave and from a fast transverse wave excited in the piezoelectric substrate, the fast transverse wave being a wave having a highest sound velocity in transverse waves produced in the plurality of additional series resonators and the plurality of parallel resonators; and a reception filter passing a signal in a second frequency band higher than the first frequency band, the reception filter being connected between the antenna terminal and the output terminal.

2. The antenna duplexer of claim 1 wherein a capacitance of the first series resonator is larger than a capacitance of the second series resonator.

3. The antenna duplexer of claim 1 wherein the protective film is a silicon oxide film.

4. The antenna duplexer of claim 1 wherein the protective film is thicker than $0.27\lambda$ ($\lambda$: wavelength of the main elastic wave).

5. The antenna duplexer of claim 1 wherein the protective film is thicker than $0.27\lambda$ ($\lambda$: wavelength of the main elastic wave) and has a projection above an electrode finger of the electrode in a cross section of a direction orthogonal to an extension direction of the electrode finger of the electrode, and a width of a top part of the projection is smaller than a width of the electrode finger of the electrode.

6. The antenna duplexer of claim 5 wherein the protective film has a curved shape which is projected downward from the top part to a lowest part of the projection in the cross section.

7. The antenna duplexer of claim 5 wherein the width of the top part of the projection is equal to or less than ½ of the width of the electrode finger of the electrode.

8. The antenna duplexer of claim 5 wherein a center position of the top part of the projection substantially corresponds to a position above a center position of the electrode finger.

9. The antenna duplexer of claim 5 wherein a relation of $0.03\lambda < T \leq h$ is satisfied, where T represents a height of the projection, and h represents a film thickness of the electrode.

10. An antenna duplexer comprising:
an input terminal, an output terminal, and an antenna terminal;
a transmission filter passing a signal in a first frequency band and having a lithium niobate based piezoelectric body having Euler angles ($\phi$, $\theta$, $\psi$), and a protective film formed on the piezoelectric body, the transmission filter being a ladder filter including a plurality of resonators, connected in series and in parallel, each resonator of the plurality of resonators having an electrode formed between the piezoelectric body and the protective film, the plurality of resonators including a plurality of series resonators connected in series between the input terminal and the antenna terminal, and a plurality of parallel resonators, the plurality of series resonators including a first series resonator disposed closest to the input terminal among the plurality of resonators, a second series resonator having an antiresonance frequency higher than the antiresonance frequency of the first series resonator, and a plurality of additional series resonators, a propagation angle of a main elastic wave of the first series resonator and a propagation angle of a main elastic wave of the second series resonator being different from each other so that an electromechanical coupling coefficient of the first series resonator is smaller than an electromechanical coupling coefficient of the second series resonator, and the Euler angles in the plurality of additional series resonators and the plurality of parallel resonators satisfying conditions of $-20° \leq \phi \leq 20°$, $-100° \leq \theta \leq -60°$, $1.193\phi-2° \leq \psi \leq 1.193\phi+2°$, and either $\psi \leq -2\phi-3°$ or $-2\phi+3° \leq \psi$, the conditions simultaneously suppressing spurious transmissions derived from a Rayleigh wave and from a fast transverse wave excited in the piezoelectric substrate, the fast transverse wave being a wave having a highest sound velocity in transverse waves produced in the plurality of additional series resonators and the plurality of parallel resonators; and
a reception filter passing a signal in a second frequency band higher than the first frequency band, the reception filter being connected between the antenna terminal and the output terminal.

11. The antenna duplexer of claim 10 wherein the protective film is a silicon oxide film.

12. The antenna duplexer of claim 10 wherein the protective film is thicker than $0.27\lambda$ ($\lambda$: wavelength of the main elastic wave).

13. The antenna duplexer of claim 10 wherein the protective film is thicker than $0.27\lambda$ ($\lambda$: wavelength of the main elastic wave) and has a projection above an electrode finger of the electrode in a cross section of a direction orthogonal to an extension direction of the electrode finger of the electrode, and a width of a top part of the projection is smaller than a width of the electrode finger of the electrode.

14. The antenna duplexer of claim 13 wherein the protective film has a curved shape which is projected downward from the top part to a lowest part of the projection in the cross section.

15. The antenna duplexer of claim 13 wherein the width of the top part of the projection is equal to or less than ½ of the width of the electrode finger of the electrode.

16. The antenna duplexer of claim 13 wherein a center position of the top part of the projection substantially corresponds to a position above a center position of the electrode finger.

17. The antenna duplexer of claim 13 wherein a relation of $0.03\lambda < T \leq h$ is satisfied, where T represents a height of the projection, and h represents a film thickness of the electrode.

* * * * *